(12) United States Patent
Speakman

(10) Patent No.: US 7,129,166 B2
(45) Date of Patent: Oct. 31, 2006

(54) METHOD OF FORMING AN ELECTRONIC DEVICE

(75) Inventor: Stuart Philip Speakman, Little Waltham (GB)

(73) Assignee: Patterning Technologies Limited (GB)

( * ) Notice: Subject to any disclaimer, the term of this patent is extended or adjusted under 35 U.S.C. 154(b) by 0 days.

(21) Appl. No.: 10/760,611

(22) Filed: Jan. 20, 2004

(65) Prior Publication Data

US 2004/0151014 A1    Aug. 5, 2004

Related U.S. Application Data

(63) Continuation of application No. 10/290,988, filed on Nov. 8, 2002, now Pat. No. 6,713,389, which is a continuation of application No. 10/068,453, filed on Feb. 6, 2002, now Pat. No. 6,503,831, which is a continuation of application No. 09/529,611, filed on Jul. 19, 2000, now abandoned.

(30) Foreign Application Priority Data

| Oct. 14, 1997 | (GB) | ................................. 9721808.5 |
| Oct. 14, 1997 | (GB) | ................................. 9721809.3 |
| Oct. 14, 1998 | (WO) | .................... PCT/GB98/03087 |

(51) Int. Cl.
*H01L 21/44* (2006.01)

(52) U.S. Cl. ...................... 438/674; 257/750

(58) Field of Classification Search .............. 438/484, 438/490, 492, 493, 497, 500, 674, 642, 652; 257/635, 736, 748, 750
See application file for complete search history.

(56) References Cited

U.S. PATENT DOCUMENTS

| 3,795,443 A | 3/1974 | Heine-Geldern et al. |
| 4,104,645 A | 8/1978 | Fischbeck |
| 4,268,597 A | 5/1981 | Klavan et al. |
| 4,291,316 A | 9/1981 | Kakeno et al. |
| 4,523,199 A | 6/1985 | Ott |
| 4,751,530 A | 6/1988 | Elrod et al. |
| 4,815,199 A | 3/1989 | Jenner et al. |
| 5,059,266 A | 10/1991 | Yamane et al. |
| 5,132,248 A | 7/1992 | Drummond et al. |
| 5,149,548 A | 9/1992 | Yamane et al. |
| 5,182,571 A | 1/1993 | Creagh et al. |
| 5,250,439 A | 10/1993 | Musho et al. |
| 5,279,678 A * | 1/1994 | Jordan et al. ................ 136/244 |
| 5,328,520 A | 7/1994 | Itagaki |
| 5,376,503 A | 12/1994 | Audett et al. |

(Continued)

FOREIGN PATENT DOCUMENTS

| CA | 2116875 | 2/1995 |

(Continued)

OTHER PUBLICATIONS

Hebner, T.R. , et al. Ink-jet Printing of Doped Polymers for Organic Light Emitting Devices, American Institute of Physics, vol. 72, No. 5, Feb. 2, 1998, pp. 519-521.

(Continued)

*Primary Examiner*—David Nelms
*Assistant Examiner*—Calvin Lee
(74) *Attorney, Agent, or Firm*—Wolf, Greenfield & Sacks, P.C.

(57) ABSTRACT

A method of forming an electronic circuit component using the technique of drop on demand printing to deposit droplets of deposition material, said method comprising depositing a plurality of droplets on a surface to form a patterned electronic device comprising multiple discrete portions.

17 Claims, 12 Drawing Sheets

U.S. PATENT DOCUMENTS

| | | | |
|---|---|---|---|
| 5,424,822 A | 6/1995 | Daniels | |
| 5,459,174 A | 10/1995 | Merrill et al. | |
| 5,502,307 A | 3/1996 | Baliga et al. | |
| 5,502,585 A | 3/1996 | Qian | |
| 5,510,066 A * | 4/1996 | Fink et al. | 264/40.1 |
| 5,512,122 A | 4/1996 | Sokyrka | |
| 5,539,100 A | 7/1996 | Wasielewski et al. | |
| 5,560,543 A | 10/1996 | Smith et al. | |
| 5,595,689 A * | 1/1997 | Kulkarni et al. | 252/500 |
| 5,598,200 A | 1/1997 | Gore | |
| 5,609,919 A | 3/1997 | Yuan et al. | |
| 5,627,578 A | 5/1997 | Weintraub | |
| 5,637,426 A | 6/1997 | Uchikawa | |
| 5,639,386 A | 6/1997 | Burke et al. | |
| 5,649,480 A | 7/1997 | Yim | |
| 5,685,491 A | 11/1997 | Marks et al. | |
| 5,705,826 A | 1/1998 | Aratani et al. | |
| 5,740,287 A | 4/1998 | Scalora et al. | |
| 5,810,988 A | 9/1998 | Smith, Jr. et al. | |
| 5,902,537 A | 5/1999 | Almquist et al. | |
| 5,930,117 A | 7/1999 | Gengel | |
| 5,958,169 A | 9/1999 | Titterington et al. | |
| 6,023,464 A | 2/2000 | Woundy | |
| 6,049,826 A | 4/2000 | Beser | |
| 6,053,596 A | 4/2000 | Nakano et al. | |
| 6,059,393 A | 5/2000 | Takahashi | |
| 6,087,196 A | 7/2000 | Sturm et al. | |
| 6,094,676 A | 7/2000 | Gray et al. | |
| 6,100,954 A | 8/2000 | Kim et al. | |
| 6,120,588 A | 9/2000 | Jacobson | |
| 6,153,001 A | 11/2000 | Suzuki et al. | |
| 6,164,850 A | 12/2000 | Speakman | |
| 6,402,403 B1 | 6/2002 | Speakman | |
| 6,503,831 B1 | 1/2003 | Speakman | |
| 6,596,224 B1 | 7/2003 | Sachs et al. | |
| 6,599,582 B1 | 7/2003 | Kiguchi et al. | |
| 6,849,308 B1 | 2/2005 | Speakman et al. | |
| 2002/0164432 A1 | 11/2002 | Hofmeister | |

FOREIGN PATENT DOCUMENTS

| | | |
|---|---|---|
| DE | 3126372 | 9/1982 |
| DE | 3728337 | 3/1989 |
| DE | 3740149 | 6/1989 |
| DE | 19654828 | 12/1996 |
| DE | 19654828 C1 | 12/1996 |
| EP | 0484808 | 10/1991 |
| EP | 0683405 | 5/1995 |
| EP | 0683405 A1 | 5/1995 |
| EP | 0761440 | 9/1996 |
| EP | 0761440 A2 | 9/1996 |
| EP | 0736580 | 10/1996 |
| EP | 0855614 | 7/1998 |
| EP | 0880303 | 11/1998 |
| FR | 2717420 | 9/1995 |
| GB | 1566113 | 4/1980 |
| GB | 2183500 | 6/1987 |
| GB | 2183500 B | 6/1987 |
| GB | 2196650 | 5/1988 |
| GB | 2202636 | 9/1988 |
| GB | 2304812 | 3/1997 |
| JP | 03057625 | 3/1991 |
| JP | 04099646 | 3/1992 |
| JP | 818125 | 1/1996 |
| JP | 08005828 | 1/1996 |
| JP | 08018125 | 1/1996 |
| JP | 080240803 | 9/1996 |
| JP | 090219019 | 8/1997 |
| WO | WO 89/05567 | 6/1989 |
| WO | WO 95/05943 | 3/1995 |
| WO | WO 95/23244 | 8/1995 |
| WO | WO 97/48557 | 12/1997 |
| WO | WO 99/19900 | 4/1999 |
| WO | WO 99/60829 | 11/1999 |
| WO | WO 01/14988 A1 | 3/2001 |

OTHER PUBLICATIONS

British Search Report for priority document GB 9721808.5—Sep. 16, 1998.
British Search Report for priority document GB 9721809.3—Jul. 14, 1998.
International Search Report for WO 99/19900.
XP-002092497, Garnier et al, abstract only, Science, Sep. 16, 1994.
British Search Report for GB 0220653.0—Oct. 11, 2002.
British Search Report for GB 0220651.4—Oct. 4, 2002.
British Search Report for GB 0220654.8—Oct. 11, 2002.
British Search Report for GB 0201275.5—Mar. 7, 2002.
Garnier, F. et al, "All-polymer field effect transistor realized by printing techniques", Science, vol. 265, No. 5179, Sep. 16, 1994, pp. 1684-1686.
British Search Report for priority document GB 97218085 (1998).
British Search Report for priority document GB 97218093 (1998).
Hebner, T.R., et al., "Ink-jet Printing of Doped Polymers for Organic Light Emitting Devices," *American Institute of Physics*, vol. 72, No. 5, pp. 519-521 (1998).
IBM Tech Disclosure Bulletin, Braille Printed Dot Configuration, pp. 1204 Aug. (1997).
International Search Report for WO 99/19900.
International Search Report from GB9912437.2 and GB 0005929.5.
Lerner, et al., "Electromagnetic Radiation," *Encyclopedia of Physics*, pp. 285-288 (1991).
Notice of Opposition in EP Patent 1163552, Appl. No.: 00935358.2 (Aug. 2003).
Translation of DE 4228 344A 1 by Dr. Herbert Feld, et al. (1994).
Translation of DE 4228 344A 1 to Feld, et al. (1995).
Translation of DE 4329 338A 1 to Nishikawa (1995).
XP-002092497 Garnier, et al., Abstract only Science Sep. 16, 1994.

* cited by examiner

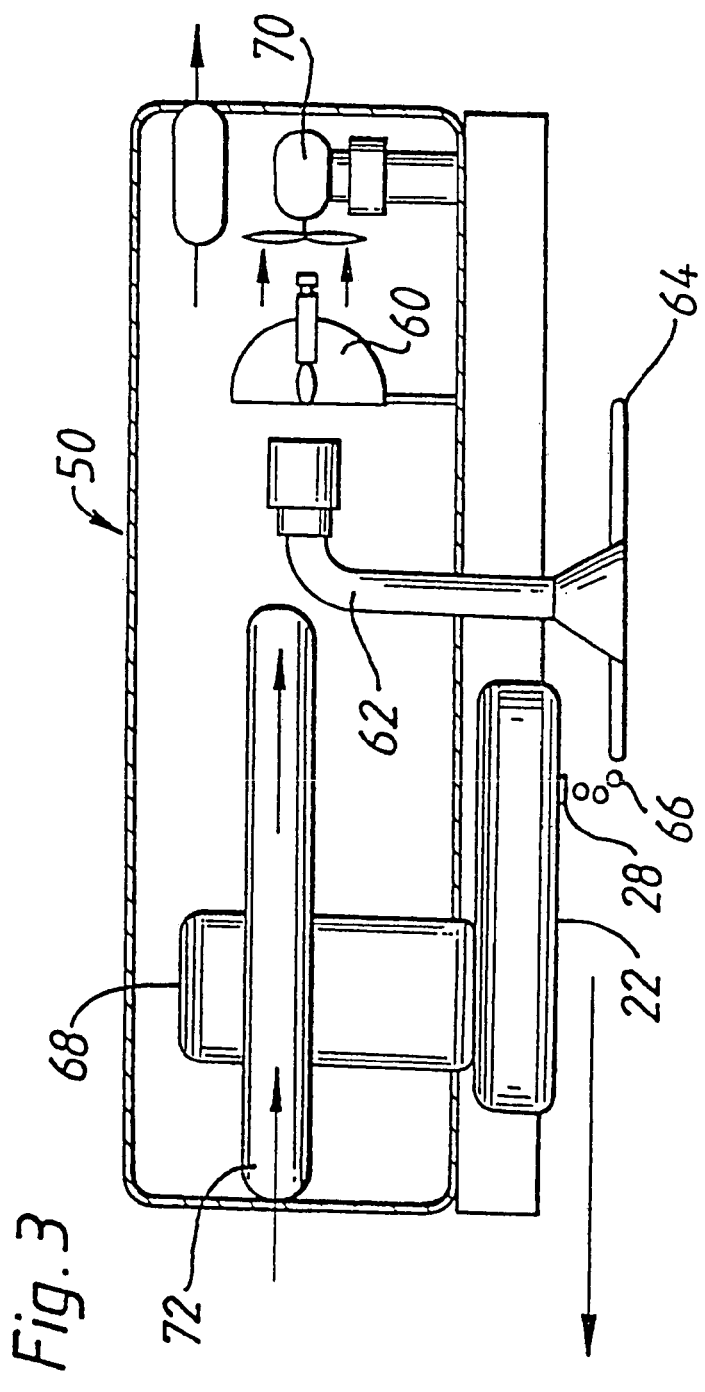
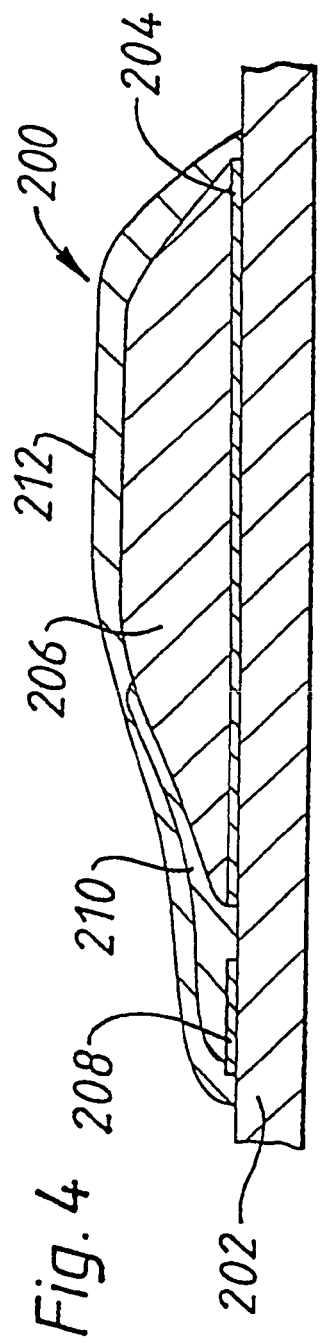

Fig.5
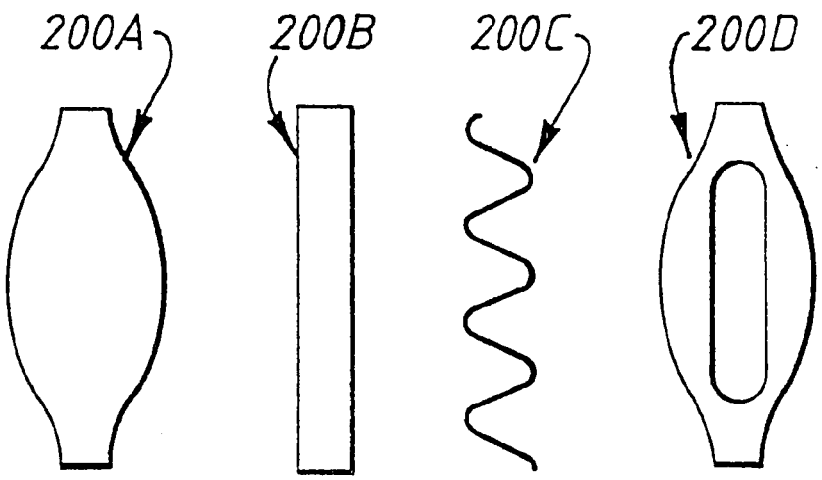
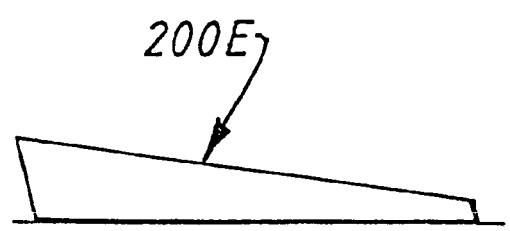
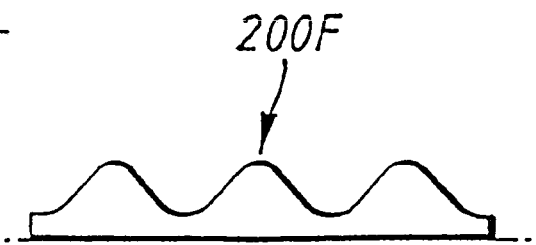
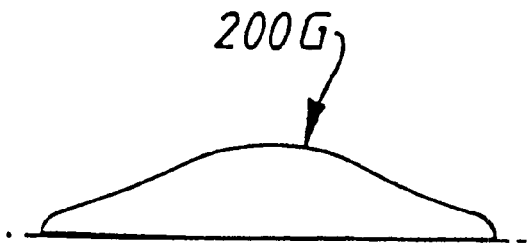
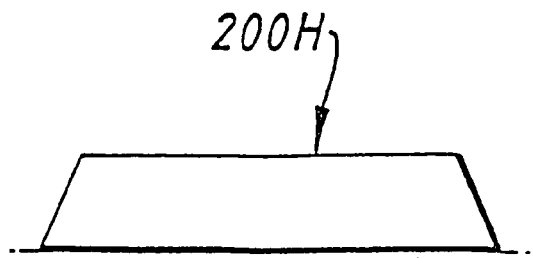

METHOD OF FORMING AN ELECTRONIC DEVICE

This application is a Continuation of prior application Ser. No. 10/290,988, filed on Nov. 8, 2002, titled METHOD OF FORMING AN ELECTRONIC DEVICE, now issued as U.S. Pat. No. 6,713,389, which is a continuation of application Ser. No. 10/068,453, filed on Feb. 6, 2002, entitled METHOD OF FORMING AN ELECTRONIC DEVICE, now issued as Pat. No. 6,503,831, which is a continuation of application Ser. No. 09/529,611, filed on Jul. 19, 2000, now abandoned.

The present invention relates to a method of forming two- or three-dimensional structures using drop on demand printing. In preferred embodiments, the invention relates to the formation of an electronic device;
the formation of an electrical circuit element;
the formation of a sensing device; and
the formation of at least part of a monochrome or colour display on a surface.

Electronic devices, and in particular integrated circuits, are the basic elements of electronic circuits. Integrated circuits typically consist of a number of discrete layers, formed from insulating, semiconductor or electrically conducting material, formed on a substrate, for example, a semiconductor substrate. These layers can form part of a component of the integrated circuit, such as a transistor, an interconnection between components, or provide an isolation barrier between components.

Conventional techniques for the fabrication of devices involve a number of different processes for forming the various layers which make up the device. Such processes include:

photolithography;
vacuum deposition;
chemical vapour deposition;
oxidation;
etching;
masking; and
dopant diffusion.

The number of processes required to manufacture, for example, a field effect transistor makes the manufacturing process slow. In addition, the use of processes such as etching and dopant diffusion which are difficult to accurately control can lead to loss in accuracy in the shape and performance of the finished product.

Drop-on-demand printing is a known printing technique whereby a droplet of ink is ejected from a ink-jet printhead. The droplet impacts with a porous or semi-porous surface, dries and forms a spot which forms a recognisable pattern and colour such as type.

According to one aspect of the present invention there is provided a method of forming an electronic device using the technique of drop on demand printing to deposit droplets of deposition material, said method comprising depositing a plurality of droplets on a surface to form a patterned electronic device comprising multiple discrete portions.

The term "drop on demand" printing includes, but is not limited to, the use of a digitally defined pressure pulse (thermally, piezoelectrically, magnetically, biological or otherwise generated) that forces the fluid meniscus out of the nozzle and into contact with a substrate surface before constriction occurs, in which the fluid is transferred from the droplet deposition apparatus to the surface due to the difference between intrinsic fluid bond strength and surface adhesion/tension effects.

The present invention can make use of an ink-jet printhead to eject droplets of one or more custom fluids that coalesce on a surface and when suitably dried form a three-dimensional feature comprising at least one, preferably most, or more preferably all of the elements necessary to form an electronic device.

The key to being able to partially or completely print, for example, a polymer field effect transistor resides in an in-depth understanding of the nature of polymeric interfaces and surfaces (polymer-polymer, polymer-dielectric, and polymer-metal) that make-up the device structure. This is especially so given the dynamic nature of the ink jet print and contact transfer processes. The subject of organic device manufacture coupled with ink jet printing is a rich avenue for both scientific and technological research and development not just covering the areas cited in this patent application but also covering hitherto unexplored ideas that will be fuelled by the high degree of processing flexibility that is provided by ink jet printing in electronic, opto-electronic, and optical device manufacture. The contact type and density (contact intimacy and barrier formation mechanism and height and nature of the structure) has a profound influence on the device performance. Given that the interfaces, and hence the surfaces prior to forming an interface, are of key importance it will come of no surprise to learn that the cleanliness state of such surfaces may be crucial. Moreover, the associated surface electronic state and surface energy plays a significant role in the behaviour of the liquid droplet or transferred fluid on the surface that results initially in a liquid-solid interface that coverts to a solid-solid interface after the printed liquid undergoes solidification. Of particular importance is the differential energy resulting from the interaction of the liquid (surface tension energy) with the solid surface (surface energy) to be printed on. The dynamics of the liquid on the surface, coupled with the solid concentration and solvent(s) type (mix ratio for two or more solvents) has a profound influence of the morphology of the printed solid. Whether printing on to a polymer surface or printing a polymer on to a surface there are some fundamental properties of "ideal" polymer surfaces that should be noted:

(i) the polymer surface may vary from partially polycrystalline to amorphous. With the exception of the polydiacetylenes, single crystal polymer surfaces are essentially unknown.

(ii) light emitting polymers tend to large, reasonably flexible, covalently bonded chains. The polymer surfaces generally consist of gently curved sections of the polymer chains, with occasional chain ends also being present. The polymer chains can be preferentially parallel or perpendicular to the surface. Of particular importance is the fact that surface energy effects can drive some side groups to be oriented preferably "out" from the surface or "in" towards the bulk of the film formed from the printed liquid, forming a variety of conformations.

(iii) the electronic surface region has dimension in the range of about 0.1 nm (1 angstrom) to 1 nm (10 Angstroms), although mechanical and chemical properties of the surface may influence the bulk material performance to a greater depth.

(iv) inorganic crystalline lattice (3-D periodicity) surface state formation defects are rarely observed on carefully prepared polymer surfaces. Dangling and unsatisfied surface bonds are rarely observed. For conjugated polymers the covalent bonds are satisfied and the largely one-dimensional nature of the polymer chains is preserved despite the gentle curvature, bending and end chain termination occurring at or near the surface.

The device structure is preferably so designed as to facilitate good interfacial reaction between the printed layers that make-up the device. The use of vertical walled structures with incorrectly defined surface wetting can lead to ineffective electrical contact at the interface thereby providing a device that will at best work outside the specified range or at worst will fail in service.

Suitable liquids that can be ink jet printed or contact transferred to provide conductive, semiconductive, insulating, and opto-electronic function include, but are not limited to, inorganics, organics, hybridised inorganic-organic systems, and polymer-based materials compatible with conventional evaporation or radiation enhanced drying, low temperature crystallisation, annealing, or curing, and radiation cross-linking or chemical bond scission or reformation.

In one preferred embodiment, the electronic device is a transistor, such as a field effect transistor, preferably for a multiple layer printed structure. The transistor may be an "all-polymer" transistor, each component of the transistor being formed from polymeric material. The printing technique can be applied to single or multiple layers of the device, for example, the organic semiconductor and/or insulator, and can also be applied to the complete printing of the device, including semiconductor layer, insulating layer, metallic contacts and the encapsulation and protective coating layers.

In order to fabricate a polymer transistor, drop on demand printing may be employed for one or more of a number of key layers, such as:

(i) Gate Dielectric

The key materials of interest for the gate dielectric include, but not limited to, BenzoCycloButane (BCB), polysiloxane, polyaniline, and polymethyl methacrylate (PMMA).

(ii) Semiconductor (Includes Light Emitting Materials)

The key materials of interest for the semiconductor include, but not limited to, pentacene and polythiophene, and for the light emitting polymer will be polyfluorene and MEH-PPV (poly[2-methoxy-5-(2'-ethyl-hexyloxy)]-p-phenylene-vinylene)

(iii) Protective Sealant

The key materials of interest for the protective sealant include, but not limited to, multifunctional UV curing acrylates and organically modified ceramics (i.e., organosilane derivative).

(iv) Polymeric Conductors

The key materials of interest for the polymer conductor include, but not limited to, polyaniline (e.g., blended with polyethylene, etc.) and polythiophene.

For example, the method may comprise the steps of depositing a gate region on said surface, depositing a gate insulator layer over said gate region, depositing a source region and a drain region on said gate insulator layer, said source region being remote from said drain region, and depositing an active semiconductor layer between said source region and drain region. The method may further comprise the step, prior to the deposition of said gate insulator layer, of depositing a gate electrode insulator layer at each end of said gate region. The method may further comprise the steps, prior to the deposition of said active semiconductor material, of depositing interface layers on facing walls of said drain and source regions into which said active semiconductor material diffuses, during deposition and/or curing thereof so as to control the barrier height of said transistor. The method may further comprise the step of depositing an organically modified ceramic layer over said transistor to isolate hermetically the transistor.

A polymeric transistor may be deposited directly on to a wide variety of substrates including, but not limited to, thin film single crystal, polycrystalline, or amorphous surfaces, single bulk crystals, glass, plastic, metal, treated or untreated paper or card, or any temperature sensitive material including low glass transition temperature plastics and possibly human skin tissues or synthetic or artificial substrates.

From computational fluid dynamic modelling a range of liquid material and diluent carrier or dopant properties has been determined that provide a means of manufacturing a practical device or element. The fluid properties and ranges include, but are not limited to:

| | | |
|---|---|---|
| Ambient pressure = | $1.01 \times 10^5$ to $1 \times 10^{-6}$ | [N m$^{-2}$] |
| Boiling point = | 0 to 250 | [° C.] |
| Droplet velocity = | 0.1 to 10 | [m s$^{-1}$] |
| Dynamic viscosity = | 1 to 200 | [mPa · s] |
| Heat of vaporisation = | Liquid dependent | [J mol$^{-1}$] |
| Liquid density = | Liquid dependent | [kg m$^{-3}$] |
| Material density = | Material dependent | [kg m$^{-3}$] |
| Material solid content = | 0.0001 to 100 | [%] |
| Static contact angle to the substrate = | 0 to 90 | [°] |
| Substrate temperature = | 270 to 600 | [K] |
| Surface tension = | 20 to 76 | [mN m$^{-1}$] |
| Temperature coefficient of viscosity = | Liquid dependent | [mPa · s K$^{-1}$] |

It has also been determined from computational fluid dynamics and mathematical modelling that both device structure and droplet properties may be tuned to optimise device performance and behaviour. In this respect the parameters which may be tuned include, but are not limited to:

Electrode geometry and thickness
Insulating layer geometry
Liquid droplet dynamic wetting rate and contact angle
Liquid droplet rheology
Liquid droplet static contact angle
Substrate fluid capillarity (wicking under existing layers)

It has also been determined from computational fluid dynamics and mathematical modelling that the printhead operational reliability and stability depends on parameters which include, but are not limited to liquid material properties, nozzle geometry and printhead manufacturing materials.

Theoretical and experimental evaluation has shown the potential to extend ink jet printing processing by using integrated accessories, such as a nozzle shutter and a solid state radiation source adjacent to each nozzle, and by changing the processing environment (vacuum, controlled gas, etc.), to influence the following properties (but not limited to) controlled interfacial miscibility, crystallisation state, material chemical reactive state, substrate surface energy, substrate surface texture, surface and bulk doping, thermal annealing and thermal reflow.

For the potential manufacture of an all-trans parent transistor the use of ITO (Indium Tin Oxide) as an transparent electrode can be replaced by using polyaniline (suitably prepared), which possesses a surface conduction and hole injection performance comparable with ITO.

The transistor may be a back-to-back diode pair, or a field effect enhancement or depletion mode transistor. Thus the printing of a transistor implies the printing of related electronic devices such as p-n junctions, photodiodes, diacs, triacs, thyristors, bipolar devices, field-effect devices, phototransistors, lasers, photodetectors, electronically stimulated light sources, superconducting computers, and very high speed UV, visible, IR opto-electronic switches [PPV and associated derivatives]. Such devices include ac, dc, pulsed, low voltage, fast switching operation. The printed devices could also be used for speech recognition input and output for facilitating verbal commands.

This printing technology can also be used in the manufacture of inorganic semiconductor devices based on materials such sol-gel ITO, Sn chloride, and other aqueous solutions.

The droplets forming respective layers or regions may be supplied by respective droplet deposition printheads. Alternatively, the droplets forming respective layers or regions are supplied by a butted droplet deposition printhead having a plurality of separate fluid supplies.

The transistor may comprise a buckminster fullerene and fulleride $C_{60}$-based transistor. The term "$C_{60}$-based" includes other structures of fullerene and fulleride molecules, including, but not limited to, $C_{70}$, $C_{76}$, $C_{78}$, $C_{82}$, $C_{84}$ and $C_{60}$-TDAE (tetrakis-dimethylaminoethylene). Such transistors possess higher mobilities and temperature stability than conventional polymer transistors.

In another embodiment, the present invention addresses the problem of manufacturing cheap, efficient thin-film based microelectric sensors for a wide range of applications and a wide range of transduction types, including, but not limited to, conductometric, acoustic, piezoelectric, photocapacitive, amperomatic and potentiometric devices.

The device may comprise a plurality of portions comprising respective layers of a multi-layer sensing device. Such a device may be a micro-, nano- or molecular thin film sensing device, that is, a sensor having a thickness typically less than 10 microns.

The application of the invention is wide. For instance, the sensing device may comprise one of a chemoresistor, a chemocapacitor, a chemodiode, a chemotransistor, a thermistor, a micropellistor, a thermoelectric sensor, a piezoelectric sensor, a surface acoustic wave device, a multiple element gas sensor, a conducting polymeric device for sensing polar molecules at room temperature, for low-powered gas sensing and odour-sensing electronic "noses", and a sensor for sensing nanobiological material possessing chirality and/or selectively recognisable receptor sites, thus extending printing technology to advanced biosensors and "cellular engineering" with numerous applications in medicine and science. A sensor may be formed on packaging for a consumable product so that, for example, a temperature excursion above or below a specified temperature may be permanently recorded. In this case, the sensor is preferably in the form of a colour chance indicator. The sensor may comprise reversibly electrically activated inks or pigments dispersed in micro- and nano-capsules. In another example, a sensor may be deposited on the surface of the packaging in order to detect the decay state of the product, in order to indicate, for example, tampering of the product. The sensor may be provided in combination with a flexible coverage for the packaging.

Printing materials may include, but are not restricted to:
phthalocyanines;
pyrrones;
indoles;
furans;
polyphenylacetates;
metallo-organics, such as ZnO and $TiO_2$;
steric acid; and
temperature-sensitive inks.

A plurality of sensors may be deposited in a one-dimensional, two-dimensional or three-dimensional array. Examples of such an array include, but are not restricted to:
biological arrays for detecting, for example, hormones, sugars and/or proteins;
chemical arrays for detecting, for example, vapours, odours, gases and/or humidity;
magnetic arrays, comprising, for example, Hall plate detectors and/or magnetotransistors;
mechanical arrays for detecting, for example, pressure, displacement and/or torque;
radiation arrays for detecting, for example, localised imaged infrared, ultra violet, visible light and/or microwave radiation; and
thermal arrays for detecting, for example, temperature and/or contact heat flow.

In one embodiment, the sensing device is an all-organic, or all-polymeric, field effect transistor. By printing a polymeric membrane on to a field-effect transistor, there can be provided a means of osmotic pressure control and membrane diffusion of active species which influence the logic state of the transistor.

It is envisioned that a suitable fluid, based on materials such as pyrroles, thiophenes, indoles, and furans, can be employed to print a 3-D structure over an electrode pattern that provides a gas sensing functionality after low temperature radiation or thermal curing. Such a manufacturing method can have a very high degree of deposited mass and film thickness control at a very high print speed, hence high device reliability and low cost process can be achieved with the ability to check deposit in-situ and rework to enhance functional yield. Multiple layer and multiple material structures can be achieved with a suitable printhead design. If appropriate, localised electrochemical oxidation can be achieved by applying a suitable electric pulse across the electrodes being coated.

In one embodiment, the sensing device is a capacitive sensing device which may be, for example, associated with and printed adjacent to the collector or drain of a transistor switching device for sensing touch or providing a switchable memory state.

Such a sensor includes a tactile array or "fingerprint" detector that works on the basis of localised (individual capacitive-cell in an array) charge-discharge mechanism of the powered capacitive element. Generally such elements are active, that is they have associated with them at least one transistor that switches on or off dependent upon the electrical charge state of the capacitive element that is located as the drain (FET: field effect transistor) or collector (bipolar transistor) segment of the switching transistor or at the gate of a second switching transistor. The device can operate by inducing charge transfer upon touch or by discharging charge upon touch thereby affecting the logic level of the transistor switching element. The capacitive element may be connected in a number of ways to influence the component value and the frequency dispersion and "Q" factor. The manufacturing principle applies to sub-micron scaled devices, as well as, to mm scaled devices.

In another preferred embodiment, the patterned electronic device is a polymeric/inorganic/organic transistor that forms the active switching element of a single or multiple element sensor. Drop on demand printing can be employed to selectively apply a sensor material directly on to the active element (collector, drain, gate, etc.) of a semiconducting diode, triode, thyristor, or transistor switching element(s). The diode or transistor array could be printed or could be manufactured using conventional thin film and photolithographic patterning techniques. An amorphous silicon transistor array is an example of such a conventional manufactured switching element array that could be used to form a sensing array device. Such a printed device could be a polymeric transistor-based circuit that provides sensor monitoring and on-board simple logic processing. Polymer transistor technology can be used to replace that based on amorphous silicon, leading to a cheaper, more mechanically flexible device.

In another embodiment, the electronic device is an organic, inorganic or hybrid organic-inorganic all-polymer pyroelectric detecting device preferably with integral sensing and switching transistor elements.

Thus, ink jet printing can be used to print an active pyroelectric material, such as a polysiloxane backboned co-polymer structure with aliphatic pendant side-chains that are substituted for phenoxy moieties of increased dipole moment, on to the active sites of a polymer or inorganic transistor array. The high pyroelectric coefficient (@15 $\mu Cm^{-2} K^{-1}$) coupled with the low material dielectric constant (@3.2) and low frequency dielectric loss (@0.015) means that this cheap, printed device has important applications in large area heat sensing requirements.

In another preferred embodiment, the electronic device is a gas sensing capacitive or resistive device provided on a transistor (field effect transistor or x-y addressable bipolar transistor). The gas sensing device may be organic, inorganic or hybrid organic-inorganic. Drop on demand printing can be used to selectively deposit a gas sensing material, such as polyaniline, tungsten oxide, or substituted phthalocyanine, for sensing nitrogen dioxide, methane, ammonia, sulphur dioxide, etc. The sensing element can double for the active gate electrode of a second transistor that is switched dependent upon the sensor state of the active coating. Using the concept of the ink jet printed polymer transistor logic circuitry it is possible to predict the cheap manufacture of a disposable or re-useable sensor that contains digital and analogue circuitry and that uses arrays of chemical field-effect transistors (chemFET's). Catalytic gate FET's may be used to detect $H_2$, $D_2$, $T_2$, $H_2$ and $O_2$, $NO_2$, $Cl_2$, $H_2O_2$, $H_2S$, propylene oxide, ethylene, formic acid, ammonia, ethanol, acetylene, etc.

The sensing device may be a temperature sensitive organic or inorganic or hybrid organic-inorganic device formed on a surface. A reversible temperature sensitive polymer material or colour-changing dye may be printed on to a surface that gets hot. An example is a cooker surface that, when it gets hot, the printed message can be clearly read to indicate danger. Upon cooling the message disappears, thereby not affecting the aesthetic quality of the product. Other applications include, but is not limited to, cups, teapots, crockery and electronic products.

The electronic device may comprise a "smart" sensing or actuating device, element, array, feature or structure. A "Smart", or "Intelligent", device is one with integration of a more complex level of pre- and main logic processing capability and some memory function (for, for example, communication with other elements or devices). The degree to which data is interpreted or discriminated (i.e. decision making capability) relative to another sensor/actuator or standard reference and errors or abnormalities can be compensated or eliminated leading to adaptation to the environment being sensed defines the level of "smartness" or intelligence. Sensors that possess a self-diagnostic capability exhibit an important attribute of a "smart" sensor.

An example of a "smart" sensor fabricated using drop-on-demand (or direct contact transfer) printing methods is an intelligent gas sensor element. Thin or thick film gas sensors (macro, nicro, nano, or molecular calorimeter, chemoresistor, chemocapacitor, chemodiode, chemotransistor) suffer from electrical off-set signal drift, sensitivity changes due to surface poisoning, and interference from other gaseous species (including water vapour) that arrive at the sensor surface at the same time (dynamic sensing) as the species of interest, limiting sensor discrimination. By forming a resistive sensing element using a single or multiple drop-on-demand printed layer(s), the following features are achievable on a flexible or rigid substrate surface:

One or more pairs of interdigitated or single element parallel or annular electrodes. Such electrodes can be fabricated using standard thin film processing and photolithographic means or can be achieved using direct printing of a suitable liquid source.

A 3-D active material whereby the variable thickness zones are adjacent to a specific pair of interdigitated electrodes and can provide the function of determining the device sensitivity, particularly the rate of poisoning (that is, the rate of uptake of species from the environment being sensed). The rate of poisoning can be determined from measurement of resistance ratio of the differing spacings of the electrode configuration associated with each thickness zone.

A printed region whereby the material(s) of interest can be deposited adjacent to the variable thickness zone in order to introduce a controlled barrier effect for differing arriving species thereby enhancing the discrimination ability of the sensor leading to an improvement in the lowering of the threshold level of the device to the species of interest.

The printing of a thermodiode adjacent to the variable thickness/barrier coated zone in order to introduce accurate temperature monitoring (and feedback control to a local heating source, where appropriate), thereby enhancing the performance reliability and reproducibility, especially for sensor arrays.

Ink jet printing can also be applied to combustible gas sensors, directly printing the resistive element that is heated as a result of the reaction between a catalytic surface and a gas species. Control over the rate of adsorption, desorption, and reaction of gases on the resistive sensing surface provides a means of determining the specific gas species present.

In a preferred embodiment, the method further comprises the step of depositing a biocompatible layer, such as a biomembrane. Biological membranes (termed biomembranes) are less than 10 nm thick and are planar structures usually formed by the self-assembly of lipids and proteins. They are known to separate two electrolyte solutions and to enable selective mass and charge and information transfer. Lipids are natural matrices of membrane-based proteins and the application of a lateral pressure can induce a transition (first order) from a liquid to a solid state. Regular or spiral crystallisation domains (2-D colloids) can occur which can be electrostatically (inhomogeneous electric field) manipulated. The printing of such biomembranes on to surfaces, such as polymeric or inorganic optical waveguides or polymeric or inorganic transistors, to form highly sensitive microsensors is of technological importance.

The biocompatible layer may or may not be part of a sensing device. Accordingly, in another aspect the present invention provides a method of forming a biocompatible layer on a substrate using the technique of drop on demand printing to deposit droplets of deposition material, said method comprising depositing a plurality of droplets on said substrate to form a patterned biocompatible layer, said layer comprising multiple discrete portions.

Thus, the invention can extend to the printing of protein-based "smart" water that can be read as if it were a fingerprint.

A further application includes the encapsulation of proteins [inorganic materials which contain biochemically active macromolecules] for applications including optical sensors for identifying chemicals, contaminants, and pollutants in both water and air, using such techniques as photometric trace element analysis. Proteins such as copper-zinc superoxide dismutase [CuZnSOD], cytochrome c, myoglobin, haemoglobin, and bacterio-rhodopsin may be embedded in optically transparent silica glass matrices [including photochromic and light-filtering glasses]. The encased biomolecules retain their characteristic reactivities and spectroscopic properties. Enzymatic reactions can occur in the pores of the glass matrix.

The present invention extends to the printing of a porous linear, dispersed or percolated columnar or irregular or regular shaped pore structure on to an inorganic or organic-based optical waveguiding structure. Thus, an ink jet printing method can be used to deposit a controlled diffusion rate (macro, micro, nano porosity) single layer or multiple layer membrane or coating on to the surface of a polished fibre optic structure or thin film polymeric fibre optic/waveguiding structure. This printed structure can act as a simplistic form of liquid chromatography, separating out species with respect to ionic or molecular radius.

The present invention also relates to the manufacture of a polymeric battery (including, but not limited to, a supercapacitor, ionic conductor and ionically conductive device) using a droplet deposition technique.

Accordingly, in another preferred embodiment, the device comprises a polymeric battery, preferably a thin film battery. Such a battery can provide a power source of limited life for driving, for example, a sensing device. Alternatively, the battery may be deposited on a smart card or electronically activated credit or information card.

The device may consist of a flexible or rigid plastic, glass or other substrate material on to which is printed a bottom contact (formed from, for example, doped polyaniline, $TiS_2$ ormocer, Li—Al), an insulating containment well (formed from, for example, PMMA, polyimide, acrylate, PTFE) an electrolyte separator (formed from, for example, PEO/$LiClO_4$, PPO/$LiCF_3SO_3$, polyphosphazene, polyelectrolyte, $LiBF_4$), a top contact (formed from, for example, doped polyaniline, ormocer, organo-metallic, colloid) and a protective coating/atmospheric barrier (formed from, for example, BCB, acrylate) to form a basic cell. The contacts and electrolyte layers may be deposited in a sandwich structure so that a specific number of cells can be printed one on top of the other to form a multiple layer capacitor or battery.

A specific example of the application of an all-printed battery is for rechargeable electronically active smart cards for banks, theatres, airports, train/bus stations, conventions and conferences. Such cards will also house a mini display so that the card holder can access data independent of the end use interrogation equipment. Intelligent cards have on-board silicon chips to provide the necessary logic processing storage. However, such devices are normally switched on by the end use equipment, i.e., bank, theatre, etc. and as such any data update can only be undertaken at such a venue.

Typical dimensions are battery height less than or equal to 2 mm, diameter less than or equal to 20 mm. Recharge cycles have been shown to be as high as 1,000 times.

An electrochemical capacitor resembles a battery in terms of general electrochemical cell design, the difference being that the charge storage is capacitive in nature rather than faradic.

Thus, the present invention extends to a method of forming a feature using the technique of drop on demand printing to deposit droplets of deposition material comprising ionically conductive organic or inorganic fluid, said method comprising depositing a plurality of droplets on a surface to form said feature.

In another preferred embodiment, the device comprises a heteroface solar cell. Such a cell can provide light-induced power for driving, for example, a sensing device.

In another preferred embodiment, the device comprises a photovoltaic structure. Preferably, the photovoltaic structure comprises at least part of a solar cell.

The present invention addresses the problem of manufacturing a cheap, efficient, photovoltaic structure that converts solar energy into electrical energy, including donor-exciton-acceptor (DEA) photocells and polymer-buckminsterfullerene heterojunctions.

The present invention can make use of a droplet deposition technique and a continuous ink jet printhead (and electrostatic spray head) to eject droplets of an array of custom fluids that when suitably dried/solidified on a specific surface form all the elements of a solar cell (photovoltaic) device. The solar cell may be a thin- or thick-film device and/or a single or multiple heteroface device.

The surface may comprise a continuous' sheet of a premetallised flexible plastic. The method may utilise a reel-to-reel process in order to make use of an in-line printing system for printing one or more layers of at least one device as required.

Printing materials include, but are not restricted to:
conjugated polymers;
monomeric and polymeric squarine dyed polymers;
metallo-organics, such as ZnO and $TiO_2$;
$C_{60}$-doped conducting polymers;
polythiopenes;
phenylenvinylenes;

and mixtures thereof.

Preferably, the method further comprises the step of depositing a layer of optical material on said solar cell. The optical material may comprise one of an organically-modified ceramic and a polymer. This layer can provide the following functions:

1. Moisture and water vapour barrier,
2. Wear resistant anti-reflection surface, and
3. Micro lenslet array for maximum light collection efficiency.

The present invention also relates to the manufacture of a molecular electronic or photonic device or structure (including quantum dot and superlattice structures) using a droplet deposition technique. As used herein, the term "molecular" includes both molecular in structure (generally carbon-based but with a few exceptions), as well as, in dimension. Molecular solids, which may be single crystals, polycrystalline, or amorphous in structure, are composed of discrete units which retain their identities as molecules in the solid phase (solidification from a printed liquid source).

Accordingly, in a further aspect, the present invention provides a method of forming at least part of a molecular electronic or photonic device on a surface using the technique of drop on demand printing to deposit droplets of deposition material, said method comprising depositing a plurality of droplets to form at least part of said device.

The molecular device may comprise an organic, inorganic, or hybrid organic-inorganic molecular electronic ultra-thin or thin device.

As the density of electronic and opto-electronic components continues to increase so the characteristic size of the individual electronic/opto-electronic elements, devices, or structures are rapidly approaching the molecular scale, which is deemed to be approximately 1 nm (10 Angstroms). It is expected that practical bulk-effect solid state physics devices will be realised at dimensions on the order of 50 nm to 60 nm (around 500 to 600 Angstroms or about 300 to 400 atoms), sometimes termed "Bulk Molecular Electronics", at which point Quantum-physics devices and molecular-based elements or structures or features will take on an active role.

Such molecular devices include diodes and transistors which are the building blocks for molecular computers or biological computers. Such devices are employed in logic circuits (Boolean algebra logic circuits i.e., NOR, NAND, OR, AND, etc.), switches, bistable transistor-based [active] or capacitive charge transfer-based [passive] polymer memory (ROM and RAM), and noise-free amplifiers.

Such memory elements also include, but are not limited to, polymeric fusible links that are either write once or, using appropriate low melting point materials, can be write many times providing a heat source is provided to facilitate a sealing of the electric field-induced polymer link fusing (breakage), and capacitive elements that are accessed using x-y addressable stripe electrodes or a transistor array.

Other molecular devices making use of intramolecular transitions and soliton switching operated by single microparticles [electrons, ions, etc.] include, but are not limited to, molecular wires, quantum interference structures, bistable tunnel diodes, single-electron devices, cellular structures, integrated non-linear optics, and magnetic bubble memories.

Thus, the present invention may extend to a method of forming an organic or inorganic quantum dot or well structure using the technique of drop on demand printing, to deposit droplets of deposition material, said method comprising depositing a plurality of droplets on a surface to form a patterned structure. This device structure particularly covers the ability of light emitting polymeric (for example high fluorescence quantum efficiency) multiple layered structures to constrain the movement of charge/photons within a specified layer (or layers) or optical microcavity, that has a suitable exit window(s) (reflection and semi-transparent mirrors) for the stimulated photon emission to be extracted out and focused as required. Line widths of less than 10 nm can be achieved. Novel light interference devices can be envisaged using the ink jet printing patterning process.

The present invention also relates to a manufacturing method whereby a droplet deposition technique is applied to the fabrication of an electronic structure that has been partially constructed using micro-electro-machined methods.

Accordingly, in another aspect the present invention provides a method of forming at least part of an electronic device using the technique of drop on demand printing to deposit droplets of deposition material, said method comprising depositing a plurality of droplets to form at least part of said device.

Said at least part of an electronic structure may comprise either an active or a passive material.

An example is the manufacture of a ferroelectrically driven silicon cantilever, in which a ferroelectric thin film is deposited on a pre-fabricated cantilever using the placement accuracy of a droplet deposition technique to deposit a sol-gel-type fluid onto the cantilever free surface, after which the ferroelectric film is crystallised using a rapid thermal processing method. A similar deposition technique can be used to form a 3-D shaped tuning mass on the end of the cantilever in order to control the resonant behaviour of the structure.

Micromachined structures, such as microsensors, require localised changes in material type or material properties. Conventional methods of achieving this necessitate the use of photolithographic patterning of whole area coatings. An example is the enhancement of an integrated accelerometer sensitivity (car air bag sensor) by loading the MEMS processed cantilever sensor structure (coupled to an MOS detection circuit) with a suitable material (e.g., gold). The loading material increases the cantilever acceleration and deflection amplitude. The printed material can be chosen for specific material properties rather than to be compatible with electroplating methods that form part of the MEMS process.

According to another aspect of the present invention there is provided a method of forming a patterned circuit element on a surface using the technique of drop on demand printing to deposit droplets of deposition material, said method comprising depositing a plurality of droplets on said surface to form said element.

The term "circuit element" used herein connotes any component of an electric circuit which comprises at least one of insulating, dielectric and conducting material, including conductive tracks between components. The circuit element may be formed from organic, inorganic, or hybrid inorganic-organic material.

In another aspect, the present invention provides a patterned circuit element formed on a surface using the technique of drop on demand printing to deposit droplets of deposition material. Preferably, said element comprises multiple discrete portions.

The present invention can make use of an ink-jet printhead to eject droplets of fluid that coalesce on a surface and when suitably dried form a three-dimensional feature.

By using the technique of droplet ejection, a circuit element can be formed using a relatively fast process that requires no hard photolithographic masks for patterning. The process can be relatively efficient, in that material is deposited only where it is required in the finished product, that is, there is no need to use any process for the removal of deposited material.

The application of the invention is wide. For instance, flexible printed circuits can be fabricated using conductive print to provide contact to the selected element for electrical access and to provide a conductive route between circuit elements.

The circuit element may comprise an electrically conductive element. In one embodiment, the conductive element is a transparent conductor element. Optically transparent conductors exhibiting better than 10 Ohms per square resistivity are of considerable interest to the electronics industry in general, but especially for the manufacture of electro-optic devices such as displays. ITO [indium-tin-oxide] is a very widely employed transparent conductor that is not easy to pattern. The ability to print such a conductor, even if a high temperature [3–400° C.] anneal was required to convert the printed feature into a patterned solid, is of considerable interest. This conductor is required for the bus lines, in that it is necessary to ensure a well defined, tight tolerance, electric field across a device pixel to ensure very good emission uniformity. ITO is the most common choice of conductor opto-electronic devices because of its low plasma frequency and its transparency in the visible. ITO has a work function of 4.7±0.2 eV dependent upon the morphology and purity of the coating and the method used to deposit it. Polyaniline is capable of matching the work function and surface conduction properties of ITO.

In another embodiment, the conductor is a metallic conductor element. The inherently better conductivity of a metal is typically required to provide the conductors used as the source and drain of a field effect transistor. The transistor either provides refresh switch for the display pixel or provides shift register output integrated driver capability. The conductor may be formed from organometallic or metallo-organic compounds, such as:

Cu[COD]hfacac—(hexafluoroacetylacetonate)Cu(1,5cyclooctadiene); and

Cu[TMVS]hfacac—(hexafluoroacetylacetonate)Cu(vinyltrimethylsilane) for the deposition of copper. Other metals, for example, Au, In and Sn, may be included in such compounds. Other suitable deposition materials include ITO sol-gel, metal colloids and inks.

In another embodiment, the conductor is a polymeric conductor. Conducting polymers or organic conductors have a multitude of applications which are further enhanced by the ability of ink jet printing to provide a directly written pattern on to a wide variety of surfaces. Such applications include, but are not limited to:

Actuators (biomedical, etc.)
Antiradiation coatings
Artificial muscle
Batteries
Capacitors
Catalysts
Controlled-release medicine delivery systems
Corrosion inhibiting coatings
Displays (LCD, LEP, EL, Ferroelectric, FED, SE-FED, etc.)
Electrodes
Electronic memory
Electrostatic loudspeaker
Electro-optic and opto-electronic switches
Fusible links
Heating devices
Lightweight thin film conductors
Magnetic devices
Membranes
Micropositioners
Microtweezers
Microvalves
Molecular electronics
Non-linear optics
Optical memory
Packaging materials
Pattern masks
Polymer-solid electrolytes
Polymer lasers
Semiconducting devices (diodes, triodes, transistors, phototransistors, LED's, etc.)
Smart windows
Supercapacitors
Superconductors
Superlattice structures (polymeric, organic, hybridised, etc.)
Transparent conductors A selection of conductive polymers includes, but is not limited to: polyaniline (including highly stretched), polyacetylene (including iodine doped and stretch ordered), polythiophene (including stereoregular), polypyrrole and polysilane compounds (including modular silylenes).

π-conjugated polymers consist of a regularly alternating system of single (C—C) and double (C=C) bonds; a condition which leads to a lower energy bandgap, $E_g$, in the delocalised π-system. The necessary, but not sufficient, condition for conjugation is the alternation of the single and double bonds along the polymer backbone. The presence of π-electrons, the wavefunctions of which are delocalised over long portions of the polymer chain when the molecular structure of the backbone is at least approximately planar, provides the unique electronic properties of conjugated polymers. The essential properties of the delocalised π-electron system, which differentiate a typical conjugated polymer from a conventional polymer with σ-bands, are:

the electronic (π-) band gap, $E_g$, is small [about 1 to 3.5 eV], with corresponding low energy electronic excitations and semiconductor behaviour.

the polymer molecules can be relatively easily oxidised or reduced, usually through charge transfer with atomic or molecular dopant species, leading to conducting polymers.

net charge carrier mobilities in the conducting state are large enough that high electrical conductivities are realised.

the charge carrying species are not free electrons or holes, but quasi-particles, which, under certain conditions, may move relatively freely through the materials.

Typical conjugated polymers include, but are not limited to: trans-polyacetylene, PA, poly(para-phenylenevinylene), PPV, and poly(para-phenylene), PPP. The best current polyacetylenes and polyanilines are on the border line of the metal-insulator transition.

The circuit element may comprise a plurality of stacked electrically conductive elements connected by via holes to provide electrical conduction between layers.

The circuit element may further comprise at least one isolation layer, the or each isolation layer being disposed between adjacent elements. The isolation layer prevents electric field interactions/interference between adjacent powered electrodes.

In another aspect, the present invention provides a method of forming an electronic circuit element comprising stacked electrically conductive elements on a surface using the technique of drop on demand printing to deposit droplets of deposition material, said method comprising depositing a plurality of droplets to form a first conductive element, depositing a plurality of droplets to form an isolation layer on said first conductive element and depositing a plurality of droplets on said isolation layer to form a second conductive element.

The droplets forming the conductive elements and the droplets forming the isolation layer may be supplied by respective droplet deposition printheads. Alternatively, the droplets forming the conductive elements and the droplets forming the or each isolation layer may be supplied by a butted droplet deposition printhead having a plurality of separate fluid supplies.

The or each electrically conductive element may comprise a track on a printed circuit board. The conductivity of the or each electrically conducting element may be in the range from $1 \times 10^0$ S.cm$^{-1}$ to $4 \times 10^5$ S.cm$^{-1}$.

In a preferred embodiment, the circuit element is an electrical resistor.

The resistor may be formed from polymeric material and may include a layer for promoting adhesion between the polymeric material and the surface, said method comprising the steps of depositing said layer on said surface and depositing said polymeric material on said layer to form said resistor.

The polymeric material may comprise one of PTFE, PMMA and polyaniline containing a suitable electron injecting barrier material.

The droplets forming the polymeric material and the droplets forming the adhesion promoting layer may be supplied by respective droplet deposition printheads.

The droplets forming the polymeric material and the droplets forming the adhesion promoting layer may be supplied by a butted droplet deposition printhead having a plurality of separate fluid supplies.

The method may further comprise the step of subjecting the resistor to infra-red radiation to "reflow" the resistor in order to maximise the "void fraction" of the resistor. This can influence the resistance value of the resistor.

In another preferred embodiment, the circuit element is an electrical capacitor.

Preferably, the capacitor comprises a first polymeric conductive layer formed on said surface, a polymeric dielectric layer formed on said first conductive layer and a second polymeric conductive layer formed on said dielectric layer, said method comprising the steps of depositing said first polymeric conductive layer on said surface, depositing said polymeric dielectric layer on said first conductive layer and depositing said second polymeric conductive layer on said dielectric layer.

The capacitor may further comprise a layer for promoting adhesion between said first conductive layer and said substrate, said method comprising depositing said layer on said substrate before deposition of said first conductive layer.

Opposing side edges of said dielectric layer may be locally thickened to eliminate electric field breakdown due to current bunching at the edges of the conductive layers.

The dielectric layer may be formed from one of siloxane and fluorinated polyimide.

The droplets forming respective layers may be supplied by respective droplet deposition printheads. Alternatively, the droplets forming respective layers are supplied by a butted droplet deposition printhead having a plurality of separate fluid supplies.

In another preferred embodiment, the circuit element is an electrical inductor.

The method may further comprise the step of isolating hermetically said circuit element by depositing an isolating layer on the surface thereof. The isolating layer may be formed from an ormocer.

In another aspect, the present invention provides a method of forming a plurality of circuit elements on a surface using the technique of drop on demand printing to deposit droplets of deposition material, said method comprising depositing a plurality of droplets to form a first circuit element, depositing a plurality of droplets to form an isolation layer on said first circuit element and depositing a plurality of droplets on said isolation layer to form a second circuit element.

Many circuits may require the use of multiple level interconnections, such as a transistor, microvia circuit or an inductive element. In order to achieve such interconnections it may be necessary to deposit insulating and/or dielectric material. Thus, the present invention extends to a method of forming a dielectric layer using the technique of drop on demand printing, said method comprising a plurality of droplets on a surface to form said dielectric layer.

This enables, for example, a resonant circuit element, such as an LCR circuit, to be formed using the technique of droplet deposition. An LCR circuit is a combination of an inductor, a capacitor, and a resistor, the values of which in combination with the drive frequency dictate the resonance performance and "Q" factor of the circuit.

Other examples of circuit elements include:
a filter circuit element,
an electrical, electronic or opto-electronic circuit network element (that is, a more complicated interconnection of components such as is used in a communication circuit. Networks include, but are not limited to, active, passive, linear, non-linear, one-port, three-terminal, two-port, two-terminal, etc.),
an electrical, electronic or opto-electronic transmission line element (that is, that element of a circuit that transmits the signal information to specified components in a particular manner. A typical example of a transmission line is a coaxial link (or cable) that has a specified impedance or termination load. Such a coaxial line may be printed in a planar format using ink jet printing methods),
a digital circuit element (that is, a circuit that contains a switching, logic or memory device. The circuit can handle analogue signals by making use of a logic element that provides analogue-to-digital (A-D) and digital-to-analogue (D-A) conversion. Such a device can be printed using ink jet methods based on polymeric transistor devices. Such digital circuits make use of Boolean algebra in the circuit design and arrangement of printed devices. Such logic operations include AND, OR, NAND, and NOR gates. Such circuits also include transistor flip-flops (T [toggled] and JK [logic inputs])),
a modulating circuit element (that is, a circuit that can provide signal information using the modulation of signal amplitude, frequency or both),
a signal conditioning circuit element.

In another preferred embodiment, the circuit element is an electrical contact deposited on an electrical, electronic or opto-electronic device. The nature of the contact area geometry and the materials employed dictates the quality of the electrical contact. Of particular importance is the surface energy of the device/component element to be contacted by the liquid droplet of a specific surface tension. For high wetting performance the difference in surface energy-to-tension is required to be small. The geometry of the device to be contacted and the interfacial nature of the printed coating-to-device surface are both crucial in determining the true performance of such a printed device/feature.

In another embodiment, the circuit element is an interdigitated polymeric electrode. Such electrodes include surface acoustic wave electrodes for a microsensor that uses molecular-engineered cyclodextrin as a coating to sense volatile organic compounds. Drop on demand printing can directly deposit a pre-patterned conductive structure on to a surface, an example being the variable spaced contact lines deposited on to a PZT piezoelectric ceramic, thick film, or thin film element to control the nature of the intrinsic bending modes set-up in the ceramic/bilaminar structure (including support plate/membrane) due to the action of an applied electric field across such a structure as a result of the potential difference applied to the electrode pattern. The drop-on-demand printing method provides a means of depositing such conductive element patterns without the need to use whole area thin or thick film deposition methods in conjunction with photolithographic patterning and wet or dry etching techniques.

An important consequence of the ability to print multiple-level conductive elements, termed "cross-over conductors", is that the region of cross-over can be used to form a circuit element, such as a resistor or a capacitor. The properties of the material sandwiched between the conductive elements may be dependent upon the dielectric properties of the droplets which have impacted and cured on the upper surface of the bottom-most conducting element.

Preferably, a plurality of droplets comprise at least one droplet of one material and at least one droplet of another material.

Printing materials may include, but are not restricted to:
conductive and semi-conductive polymers, for example:
co-polyaniline;
polyacetylene derivative;
poly(para-phenylene);
polythiophene;
inorganic polymers; and
particulates including, for example, gold, nickel coated polystyrene and graphite;
polymer blends and mixtures;
organically modified ceramics ("ormocers");
organically modified silicates ("ormosils");
sol-gels; and
cermets.

Thus, the present invention can use low or zero toxicology-rated fluids.

In one embodiment, the deposition material comprises a micro- or nano-particulate loaded polymeric compound. Drop on demand printing can be used to form particulate loaded systems either by using pre-loaded fluids, but more importantly by using an integrated particulate dispensing system that is adjacent to each nozzle. The particulates are dispensed using a piezoelectric transducer cavity that ensures the particles do not stick together. Each dispenser is addressable independently and has associated with it a shutter assembly to seal the particle dispenser orifice. Particles of size less than or equal to 5 microns are expected to be the size of interest, although larger particles can be employed if desired. The shutter assembly may form part of a larger assembly that seals the ink jet nozzles as well, or it may be a standalone assembly. In any event the movement of the shutter assembly or assemblies will be such as to ensure particulate transfer prior to, during, or after the printing of the polymeric, organic, or inorganic binder material.

A further embodiment of this approach to providing a particulate-loaded thin film structure is to employ a solvent-based fluid for the particle, that employs a nozzle large enough to eliminate flocculation-based nozzle blocking. The liquid-particulate system permits the dispensing of mono-dispersed droplets that evaporate in flight to provide the necessary particle(s) that become embedded in the binder material or surface being printed on. The dual printing process can be performed under vacuum (soft vacuum of less than or equal to $1 \times 10^{-3}$ Pa) or in air or in a controlled gaseous environment. In-situ radiation processing can be introduced to enhance the evaporation rate of the solvent, as well as, to influence the uptake and/or functionality of the particulates in the binder film.

The viscosity range is preferably less than or equal to 100 centipoise (cps), based on 100% solid and dilute systems. The surface energy of such fluids may be in the range from 15 to 75 dynes.cm$^{-1}$. Consequently, a low surface energy nozzle or a controlled wetting nozzle annulus may be required to minimise surface wetting and the concomitant drive voltage required to expel a droplet from the nozzle.

In yet another preferred embodiment, a circuit element is formed from chemically-modified polymeric-based or inorganic-based fluid. Preferably, the fluid comprises conductive particles. Preferably, the conductive particles have a dimension less than or equal to 5 microns.

In yet another aspect, the present invention provides a method of imparting electrical conduction to at least part of a partially cured insulating layer using electrostatically focused electrically conductive particles deposited using drop on demand printing. Drop on demand printing can be used to selectively introduce a liquid to a surface to induce electronic state changes at, or close to, the point of printing in order to create a controlled change in the electronic performance of the bulk, thick film, thin film material to be treated. Such controlled doping or loading of a surface/sub-surface region introduces mobile charges that affect the current carrying capability/mobility of the device being locally doped with a majority (or minority) carrier impurity. The doping can introduce local material property changes as a result of the mode of doping, including chemical, protonic, electrochemical, optical, and electronic.

The conductive particles may be charged to assist directional steering of the particles towards a selected region of said layer. This method can be applied to the formation of an entire electrically conducting element, such as a track, or to a specific location, such as a contact region where the conductive particles improve local conduction to provide a region having a lower contact resistance and which may be used as a bonding platform. The rate of diffusion of the particles into the layer may be determined by at least one of the type and intensity of the radiation used to fix or fully cure the layer.

The size of a circuit element may be determined by at least one of surface wetting, droplet volume, and solid content of the fluid to be ejected, as well as any shrinkage that may take place for different degrees of curing.

The substrate surface energy dictates the control over the fluid spreading, or wetting, assuming that the curing process is implemented after the fluid has wet the surface. Controlled coalescence of sequential, in-line drops can be achieved either by modifying the software-controlled index distance that the printhead travels between successive droplet release, or alternatively, or additionally, irradiating the surface with a suitable secondary energy source which influences the fluid wetting and surface transport by increasing the rate of drying so as to promote thixotropy and a significant change in rheology. This control permits the build-up of material independently in all three dimensions.

The method may further comprise the step of electrically isolating the surface before forming said circuit element thereon. This step may comprise depositing an adhesion-promoting layer on said surface.

The surface or substrate may be flexible. For example, the surface may comprise a flexible plastic, preferably polyethylene, sheet. The surface may be either planar or irregular.

The circuit elements can form an enabling step for the generic technology of printing circuits on to temperature-sensitive substrates, such as polyethylene flexible plastic sheet. Such circuits include, but are not limited to, filters, resonators, networks, transmission lines, digital circuits, modulators and signal conditioners.

Advantageously the method further comprises the step of subjecting the deposition material to radiation treatment before, during or after deposition. The print surface may be subjected to radiation to prepare it for the deposition material. Employing in-situ UV and infrared radiation exposure can provide considerable scope for modifying the reaction of the droplet, for example, in order to promote material reflow, recrystallisation, mixture blending or bulk/profile smoothing, in order to achieve the required feature and profile.

The present invention also extends to a method of forming an actuator using the technique of drop on demand printing to deposit droplets of deposition material, said method comprising depositing a plurality of droplets on a surface to form a patterned actuator. Ferroelectric-based crystalline sensors and transducers may be formed by drop on demand printing. A ferroelectric ceramic fluid (such as ethylene glycol based lead acetate—titanium/zirconium isopropoxide solution) may be employed in a printing system for printing a 3-D structure that is crystallised in-situ using an integral rapid thermal annealing source (medium-to-high temperature). It is also envisaged that the liquid droplet can be pre-treated in-flight including evaporation/volatilisation/energy transfer/in-flight solidification which can be assisted by in-situ lamp, laser, solid-state device, or semiconductor-based radiation source (of electromagnetic wave spectral bandwidths spanning, but not limited to, soft X-ray, deep ultraviolet, ultraviolet, visible, infrared, microwave) depending upon the specific property being sought. Such a wavelength selectable radiation source can either provide whole area exposure covering the pathway from the nozzle to the substrate surface or could provide a steerable focused/collimated, high intensity radiation (i.e., solid-state [including semiconductor] laser, LED) source that can be mapped on to a single nozzle (matching nozzle density to laser output density). Thus, a drop on demand printing method can be used to deposit a pre-patterned thin or thick film coating of a piezoelectric ceramic on to a suitable substrate. An example is the printing of an ink jet printhead array that makes use of silicon membranes on to which are deposited the actuating element material PZT as a sol-gel solution. It is envisaged that the printing process may be applied to the complete printing of an all thin film liquid droplet ejection actuating device.

The present invention also extends to a method of forming an electroelastomeric feature using the technique of drop on demand printing to deposit droplets of deposition material, said method comprising depositing a plurality of droplets on a surface to form said feature. Drop on demand printing may be used to in-fill a containment well with an electroelastomeric material. The well may be associated with a pair of electrodes placed above and below the electroelastomeric feature. The outer electrode may be a conductive latex-type material that readily deforms as the electroelastomeric feature is stimulated with an electric field.

The present invention also extends to a method of forming a magnetic device using the technique of drop on demand printing to deposit droplets of deposition material, said method comprising depositing a plurality of droplets on a surface to form a patterned magnetic device.

One application of this invention includes but is not limited to, the manufacture of polymer ferromagnetic structures. In particular ferromagnetism in organic radical crystals concerning both charge transfer complexes of $C_{60}$ and tetrakis(dimethylamino)ethylene and stable orthorhombic phase crystal structure of the organic: compound p-nitrophenyl nitronyl nitroxide (p-NPNN). Similar materials to these, that can be solubilised, are of importance in the printing of polymeric ferromagnets. A further embodiment is the printing of a GMR read-write head. A further embodiment of the invention is to use digital printing to deposit a magnetic polymer or magnetic particulate loaded polymer on to a flexible substrate such as a plastic tape (DVD tape).

The present invention also extends to a method of forming a wavelength selective filter using the technique of drop on demand printing to deposit droplets of deposition material, said method comprising depositing a plurality of droplets on a surface to form a wavelength selective filter. The filter may be formed with a dot, stripe, or three-dimensional structural form. Formation of an electrochromic wavelength selective or electric field activated optical wavelength selective colour thin film shutter can be achieved using drop on demand printing. The use of tungsten oxide (sol-gel, organo-metallic, etc.) thin films for neutral density selective filtering is also possible with this printing process. The concept is to use an electric field driven material to promote the necessary colour filter response. This is not a passive filter printing process.

The present invention also extends to a method of forming a combined electrical and optical cable using the technique of drop on demand printing to deposit droplets of deposition material, said method comprising depositing a plurality of droplets on a surface to form said cable. The cable may be suitable for providing power and data communication between electronic boards and hardware (PC's, mainframes, plotters, etc.). The need to transfer video, audio, DAT, and other electronic and opto-electronic data at a very high speed and bandwidth has driven the need to employ optical fibre communication waveguides. Such waveguides can be constructed in planar format using ink jet printing. The integration of such active electro-optical and passive optical printed devices on to a flexible printed circuit platform forms the basis of a combined power and high speed communication data connection ribbon or cable. The flexible sheet material, (plastic, paper, etc.) may have the metal electrode pattern printed using ink jet methods as well. In this instance a multiple ink jet printhead-based system will be employed for manufacturing such ribbon cable via reel-to-reel process. It should be noted that the printed or conventionally formed metal electrode can be protected from the atmosphere and aqueous corrosion by encapsulating it in a hybrid organic-inorganic coating, such as an ormocer or sol-gel or a modified alkoxide coating [e.g., methyltriethoxysilane (MTEOS), dimetylydiethoxysilane (DDEOS)].

The present invention also extends to a method of forming a photonic imaging array including a multiple layer structure having thickness selectivity for wavelength absorption/discrimination using the technique of drop on demand printing to deposit droplets of deposition material, said method comprising depositing a plurality of droplets on a surface to form said imaging array. Drop-on-demand printing may be used to selectively build-up a passive or active filter on to a discrete region of an active imaging site in order to facilitate wavelength selectivity within a portion of the pixel. The charge accumulated can then be selectively processed using standard electronic integration and read-out (shift register) circuitry.

The present invention also extends to a method of forming a polymeric or organic neural network using the technique of drop on demand printing to deposit droplets of deposition material, said method comprising depositing a plurality of droplets on a surface to form said neural network. Special-purpose massively parallel processors can be designed which are based on the model behaviour of the human biological neurones (cell body+axon+dendrites+synapses) that conduct nerve impulses. Using such a function (electronic analogue based on stimulated activation level induced proportional voltage level response) digital computing is possible and arrays of artificial neurones would be combined to provide the necessary parallel processing action required for selected very high speed computing applications.

In conventional memory chip applications at least one transistor is used per bit of memory stored. In a printed neural network, a synapse (the elementary unit of storage) can be made using a simple resistor. This opens the possibility of neural-network devices having very large, dense memories. Although such synapses are not 100% efficient at storing information the synapse array may also serve as an information processor. Typical dendrite and axon electrodes are insulated from each other using materials including polyimide and polymethyl methacrylate. The lower resistance of the synapse can be achieved using materials such as a polyaniline-polyester blend or amorphous silicon. The printing process defines the micro- and the nano-via device structure required to provide the synaptic function. The resistance of the synapse depends upon the choice of resistor and the area and thickness of synapse region.

The ink jet printed synapse diameter can be reduced to less than 1 µm.

The present invention also extends to a method of forming an organic or inorganic superlattice structure using the technique of drop on demand printing to deposit droplets of deposition material, said method comprising depositing a plurality of droplets on a surface to form said structure. Drop on demand printing can be used to form polymeric lasers with multiple outputs and with variable exit windows. The primary area of interest is in polymeric lasers based on either microcavity optically pumped (end mirror structure with Nd:YAG stimulated emission) or electrically stimulated configurations. It is known that MEH-PPV has a high enough fluorescence quantum efficiency in solution to make it a key material in the manufacture of a polymer dye laser.

The present invention also extends to a method of forming a nanoscale patterning mask feature using the technique of drop on demand printing to deposit droplets of deposition material, said method comprising depositing a plurality of droplets on a surface to form a nanoscale patterning mask feature.

Nanoscale masking requires that the masking feature be less than 1 micrometer in either the x-axis, y-axis, or both. This implies a feature of size less than or equal to 999 nm. In order to achieve such a feature it is necessary to consider the issue of solution type, surface wetting and liquid drop surface tension effects, and the potential for nozzle blocking. To alleviate such limitations it is possible to consider methods that promote drop reduction in flight so that the drop arriving at the surface to be patterned/printed on is less than feature size of interest and to introduce a method of pre-treating the surface either before drop impact or during/post drop impact so as to limit surface spreading of the masking fluid. The actual thickness of the nanoscale patterning mask feature depends on the concentration of solid in the printed drop and on the number of layers that are printed one on top of the other.

An example is a method of forming a nanoscale masking feature using a single or multiple drop-on-demand ink jet printed layer(s) whereby the following features are achieved en route to a flexible or rigid substrate surface:

Employ a printhead (single nozzle or nozzle array) that has a nozzle size of essentially 25 µm [microns] diameter, preferably less than or equal to 10 µm [microns] diameter.

Use a material that forms a highly homogeneous solution that has been filtered to 0.1 microns and that is soluble in a wide variety of solvents, preferably low boiling point solvents. The solution can be a mixture of variable boiling point solvents to facilitate easy jetting, elimination of nozzle drying, and controlled in-flight evaporation;

Such evaporation/volatilisation/energy transfer/in-flight solidification can be assisted by in-situ lamp, laser, solid-state device, or semiconductor-based radiation source (of electromagnetic wave spectral bandwidths spanning, but not limited to, soft X-ray, deep ultraviolet, ultraviolet, visible, infrared, microwave) depending upon the specific property being sought. Such a wavelength selectable radiation source can either provide whole area exposure covering the pathway from the nozzle to the substrate surface or could provide a steerable focused/collimated, high intensity radiation (i.e., solid-state [including semiconductor] laser, LED, etc.) source that can be mapped on to a single nozzle (matching nozzle density to laser output density).

The present invention also relates to the deposition of soluble or dispersed phosphors and dyes contained in a suitable fluid medium for the purpose of providing a selective area deposition of the said phosphor for device applications.

An example is the use of this technique for field emission flat panel displays in which it is necessary to have a phosphor layer that emits photons when impacted by energised electrons. The deposition technique can be employed to provide one or more phosphor layers adjacent to an imaging pixel on a typically glass cover that houses the transparent top contact.

Another example is the use of a deposition technique to apply stripe or pixel dye filters to both photovoltaic (visible and infrared CCD imaging arrays) and emissive (polymer electroluminescent diodes and displays) devices that require selective area filtering. The dyes and/or phosphors can be deposited in 3-D as required, with the height variation being selective over the deposition surface. Typical deposition materials include ferrous chelates, silicophosphates and ormocers.

Home and business computers are becoming increasingly faster and require high speed transfer of graphics. In the limit this will require the use of optical communications, which are currently serviced by fibre-optic cables.

The present invention relates to the application of a droplet deposition technique to the manufacture of a cable that contains electrical highways for power transfer and/or optical highways for information transfer covering UV-visible-IR electromagnetic radiation and also including charge transfer/moderate power density electronic signals making use of conducting polymer tracks.

Accordingly, in another preferred embodiment, the electronic device comprises an optical waveguide, at least two adjoining portions of said waveguide being formed from different deposition materials. Preferably, the method comprises the steps of depositing a polyimide layer on said surface, a PMMA layer on said polyimide layer and an organically-modified ceramic layer on said PMMA layer. The surface may be flexible, preferably a plastics sheet.

The present invention also extends to a method of forming a dual wavelength optical fibre with integral cladding using the technique of drop on demand printing to deposit droplets of deposition material, said method comprising depositing a plurality of droplets on a surface to form said fibre. The waveguide may be inorganic, organic or hybrid inorganic-organic. The waveguide may have a common ground and outer cladding material with two optical cores separated by a central cladding to minimise the evanescent wave loss due to the two wavelengths of light of interest. The two sources of light may be channelled into the correct waveguide by using a wavelength selective geodesic lens structure at the entrance and exit of the waveguide.

In another preferred embodiment, the electronic device comprises a charge handling conductor. Preferably, the charge handling conductor is formed from polyaniline.

The ability to directly print encased thin film optical waveguides and charge handling conductors on to a ribbonlike flexible sheet plastic (for example, polyester, polyimide, and trade named materials such as melinex, mylar, kaladex, kapton) cable, preferably based on a reel to reel processing method, can provide a cheap and reliable source of cable for such applications.

The present invention also relates to the deposition of three-dimensional ferroelectric thin film electro-optic device structures (such as an optical waveguide, non-linear optic cell, high speed optical switch) which makes use of, but is not restricted to, an ethylene glycol-based fluid source.

The method of manufacture may use a droplet deposition technique whereby a ferroelectric solution (such as solgel, ormocer, polymer) is deposited in droplet form from a printhead. The droplet volume can be such as to permit the deposition of a controlled cross-section profile of an electro-optic structure. The deposit material can, in general, require high temperature processing in order to induce the correct crystallography in the fully sintered form required for reliable operation. One or more layers of material may be employed in the construction of a complex device, such as a wafer-scale optical computer.

The present invention extends to a method of forming an optical processor using the technique of drop on demand printing to deposit droplets of deposition material, said method comprising depositing a plurality of droplets on a surface to form said processor. An optical processor is typically a circuit that can process in a logical fashion information that comes in the form of packets of light or photons of a specified wavelength. The processor is typically made-up of active (non-linear) and passive optical waveguides, optical emitters and detectors, mirrors, optical shunts and such like.

The present invention also relates to the deposition of a polymeric fluid that, when cured using a suitable curing technique (for example, UV-visible-IR radiation, air drying, RTP), will result in a structure that under the application of a suitable magnitude of current will undergo thermal breakdown, leading to a discontinuity in the conduction pathway between the x-y addressable contacts that are powered with respect to that fusible link.

Accordingly, in another preferred embodiment, the electronic device comprises a fusible link. The fusible link can be accessed so as to define a specific logic array pattern for use in the hardwiring of a motor sequencer or other such electronic drive or sequencer (for example, as in a washing machine programmer).

The present invention also relates to the manufacture of a thermal imaging array using a droplet deposition technique.

In another aspect, the present invention provides a method of forming at least part of a thermal imaging array using the technique of drop on demand printing to deposit droplets of deposition material, said method comprising depositing a plurality of droplets on said surface to form at least part of said thermal imaging array so as to comprise multiple discrete portions.

A basic structure consists of an active matrix transistor array (printed polymeric, amorphous silicon, crystalline silicon, etc) onto which is deposited an insulating layer with a hole left adjacent to each imaging pixel. The hole is then filled with a charge transfer polymer that possesses a low thermal conductivity. The specific thickness of the insulating layer is dependent upon the temperature resolution required. Another material is then selectively deposited on to each pixel site of the image, making contact with the exposed charge transfer material contained in the insulating layer. This material can be an infrared responding material such as a PLZT sol-gel or similar material. An infrared transparent contact such as polyaniline is then deposited over the whole device to provide a suitable top contact to define the capacitive elements associated with each imaging pixel.

The present invention also relates to the ink-jet printing of a magnetic thin- or thick-film device, such as a magnetometer, magnetoresistor, magnetodiode, and magnetotransistor. In another preferred embodiment, the device comprises a magnetic thin- or thick-film device, at least two adjoining portions of said device being formed from different deposition materials.

By way of example a DC SQUID (superconducting quantum interference device) magnetometer consists of deposited layers which form the pick-up loop (typically 100 pH), spiral input coil (flux transformer—typically 100 mH), base electrode, counter-electrode (ground plane for input coil) plus junctions to the base electrode, insulator and protective covering.

Typical materials include iron oxide, $LiFeO_8$, $YBa_2Cu_3O_{(7-x)}$ etc. Typical application areas relating to all proposed device types include, but are not limited to, are biomagnetism, geomagnetism, security (for example, identity cards), laboratory and non-destructive measurements and naval communications, and giant magnetoresistor memories.

The present invention also relates to the application of a droplet deposition technique to form a conventional and electroluminescent back-lite and emissive thin film stacked holographic device or structure.

The present invention also relates to the manufacture and use of a polymer light emitting diode (LED) linear or area array for the curing of radiation crosslinkable drops ejected from an ink-jet printhead on to a wide variety of planar and shaped surfaces.

Such a polymer LED can be manufactured using at least one of evaporation, sputtering, spin-casing, L-B, and droplet deposition methods; The polymer LED array preferably has as an integral part a lens array that provides local pixel or a line source focusing of the electroluminescent radiation into a point or line respectively. This lens system can be manufactured using at least one of evaporation, sputtering, spin-casting, L-B, and droplet deposition methods.

The polymer electroluminescent material can be selected and tuned for a specific wavelength range and suitable materials include, but are not limited to PPV [poly(p-phenylene)] and MEH-PPV [poly(2-methoxy,5-(2-ethylhexoxy)-1,4-phenylene-vinylene)].

The polymer LED can be manufactured adjacent to the nozzle array with at least a single emissive pixel being associated with each nozzle.

In another embodiment of the invention the nozzle bore (extended or planar nozzle) is circled by the polymer LED material thus forming a radiation zone within the placement area of a drop with an overlap area of 0.5 of the drop wetting area, thereby permitting the printhead to be moved in any direction and the dispensed drop will always be irradiated.

The present invention also addresses the problem of directly transferring devices on to temperature sensitive and/or irregularly shaped surfaces, such as thin (2 to 100 micron) flexible, low temperature plastic sheet, such as polyester or polythene, curved windscreens in aircraft and automobiles and curved surfaces associated with head visors and glasses.

The present invention also addresses the ability to provide both reflective and transmissive display devices.

Accordingly, in another preferred embodiment the device comprises a monochrome or colour display.

The present invention can makes use of a printhead to deposit droplets of an array of custom fluids that when suitably dried on a surface form all of the elements necessary for, for example, a planar flat panel display.

Display types include, but are not limited to:
polymeric and/or organic electroluminescent displays;
field emission displays;
electrochromic displays;
photochromic displays;
liquid crystal displays;
electroluminescent displays; and
ferroelectric displays.

The application of the invention is wide. For instance, directly deposited full colour, high resolution displays can be fabricated on selected areas of a planar or three-dimensional irregular surface. The surface can be rigid or flexible, and can be conductive, semiconductive or insulating.

The objective is to use the ink jet printing method to print either the active matrix switching array, or the display pixel, or both, the printing being especially for multiple layers with a given device type/structure but is equally of importance for single layers within each device type. The key area of importance is the electronic state of the printed interfaces between the active elements of the transistor or the display pixel.

The transistor switching array is first printed on the flexible substrate to form the active matrix backplane. Display pixel containment wells are then printed adjacent to the switching transistors (set of transistor and charging capacitors per colour pixel set). The containment well geometry being such as to optimise the effect of surface wetting and planarised in-fill.

The light emitting polymer pixel can be formed using containing walls to limit the interpenetrability of the different fluid types required to deposit the transistor and the light emitting pixel or the different emission colours of a full colour display. The width of such well structures falls within the Rayleigh Criterion for the viewing distance of the screen. Rayleigh's criterion suggests that one agrees to call the patterns being observed distinguishable when the first minimum of one falls on the central maximum of the other (or better). When the pupil is small the resolving power of the eye is about $10^{-4}$ radians of arc. This controls the minimum separation of points that are to be distinguishable: one can "just resolve" points 0.1 mm (100 microns) apart when they are 250 mm from the eye. This would reduce to about 40 microns at a viewing distance of 100 mm. The material is of such a nature as to be opaque to UV and visible light.

All-polymer displays include, but are not limited to, light emitting amorphous and small molecule polymers, ferroelectric polymers, electrochromic polymers, photochromic polymers, electrorheologic polymers, electroactive polymers, electro-optic polymers, opto-electronic polymers, and liquid crystal polymers.

For polyaniline (or polyaniline+up to 70 wt % $TiO_2$ particles of size @20 nm) multiple colour changes occur at different electrode potentials in the range −0.2 to −1.0 volts (taken with respect to a standard calomel electrode). The colour varying from yellow, through green to dark blue. Polyaniline is usually operated at below the second oxidation potential, thus providing one colour change from pale yellow to green. This means that for full colour displays the polyaniline material needs to be combined with another material such as tungsten oxide or Prussian blue. Photoreduction-based electrochromism is also a possible operating mechanism.

A typical flexible substrate would be poly[ethyleneterephthalate] (PET).

The specific areas in display device manufacture that can be addressed using ink jet printing methods are outlined below:

(i) UV-Visible Blocking Layer

The function of this layer is to eliminate stray light associated with the interelectrode gap from exciting the luminescent polymer. The blocking layer has a width of the width of the ITO gap+5 μm. For high resolution displays this implies a width of order 5 to 10 μm. However, 50–100 μm features can be employed for lower resolution displays and to demonstrate the applicability of the printing process. The anticipated layer thickness is anticipated to be about 20 μm, although it is expected to reduce to about 3–4 μm with development of materials, aim at blocking specific wavebands, and the understanding of the layer performance. The edge definition [user's would prefer vertical walled] is of importance due to the need to provide pixel clarity for the viewer. Consideration will need to be given to the potential for using layer-on-layer processing [in-situ curing of each layer before printing the next, either sequential printing or dynamic drop-on-cured-dot] in order to provide a pillar structure that approximates to a near vertical walled feature.

(ii) Phosphor Well

The phosphor well defines the location of the luminescent material. The well is bounded by the WV-visible blocking layer, which could be conductive or insulating or have an insulating core and a specific electrically conducting outer surface. A typical well width is 100 μm, but it is expected that this thickness will reduce to less than or equal to 5 μm [micron]. Achievement of the blocking layer structure, described above, constitutes achievement of the phosphor containment well. The objective in this instance is to coat the well with the required phosphor. It is envisaged that the well may be filled with a homogeneous material that possesses a planar, smooth surface. The aspect ratio of the well is of importance here with respect to the material filling performance, due to surface energy-surface tension effects and whether one or more drops of liquid are employed to provided the required well in-fill. However, it is also possible for the phosphor to only coated around the cell wall. A wide variety of inorganic or organic-based phosphor materials can be used for this purpose.

(iii) Reflective Phosphor Well+Absorptive Blocking Layer Cap

The objective for the requirement to use this potential well structure is to maximise the efficiency of the phosphor output, whilst minimising the potential for stray light reflection affecting the pixel definition. Each well would have a different reflection coefficient designed, using multiple layer containment wall build-up methods, to match the phosphor output wavelength of interest.

(iv) Reflective Phosphor Well

Leading on from the well performance outlined above it would be possible to consider constructing a standard well using a simple material that provides the necessary UV-visible light absorption. It would then be possible to consider coating this structure (using ink jet methods) with a single layer material or multiple materials forming a stacked optical layer structure [optimised for the colour to be optically reflected—nano or molecular layer thickness] that lines the well walls with a suitable reflective material.

(v) Protective Overlayer

Since most phosphors are prone to hydroxyl ion attack it is necessary to protect the phosphor once it has been deposited. Ideally this should be performed in such a way as to print the materials of interest in an ambient devoid of water vapour and oxygen. This transparent protective layer also wants to be planar and smooth, although a low level of low frequency roughness could be tolerated [not defined or modelled].

It is possible to encase the phosphor at the well site, making a continuous layer redundant. This will provide a high degree of mechanical (flexible substrate devices) and processing flexibility. It is understood that the actual layer thickness needs to be controlled to better than 500 Angstroms [0.05 µm]. This overlayer could be a multiple layer structure designed to enhance the barrier performance whilst also optimising the light transfer [anti-reflection coating] characteristic.

(vi) ITO Electrode-to-Phosphor Well Auto Alignment

The current display manufacture requires that two separate components are bonded together. The bonding is not hermetic since a hole needs to be left in the structure in order to evacuate the assembly prior to back filling with the liquid crystal that modulates the display output. The piece parts are separated by a precise distance prior to bonding by introducing a number of spherical beads [understood to be glass, but could be of other material]. The advanced manufacturing concept here is to use ink-jet to print a thermosetting plastic of a precise volume and chemistry such that when the cover is presented to the base the thermoplastic is in close proximity to a wettable pad. The thermoplastic is then reheated (controlled reflow) and the surface tension of the spacer array wets the alignment pad on the cap and pulls the plates into register. Cooling the thermoplastic seals the device and also sets a precise spacing. It does however, establish a method that is cheap for accurate alignment of the transparent electrode to the phosphor well, thereby influencing pixel definition quality.

(vii) Phosphor Well Etch Mask

An alternative process is available for the formation of the phosphor well array. This process requires a wet [possibly dry—reactive ion etch] etch patterning mask to be deposited on to the base carrier glass plate. The plate would then be etched and the mask either removed or left in place dependent upon its impact on display performance.

(viii) Product Labelling

This is providing a means of printing information, bar codes, etc. on individual boards, with a unique code or marking for reverse-engineering and Quality Assurance purposes onto the base of the display before the transparent protective layer is deposited.

(ix) Polariser Patterning

The polariser in its simplest form is a linear array of lines and gaps that interfere with the orthogonal E [electric field vector] and M [magnetic field vector] waves in the light [electromagnetic radiation] being transmitted. However, for more complex device structures the polariser needs to be more complex, being based on a diochroic crystal arrangement. For optimum crystal ordering this would necessitate having to in-situ radiation pretreat the substrate surface or print a surface catalytic layer pattern onto which the dichroic crystal could be printed in the correct/required crystal orientation.

(x) Backlight Collimation

It is possible to consider the printing of a micro lenslet array [controlled refractive index acrylates with multiple layer structure to define optical ray path] that assists the collimation of the backlight used in a wide variety of displays, including active matrix liquid crystal.

(xi) Backlight Printing

It is possible to consider printing the backlight based on a light emitting polymer principle [output light wavelength in the range 300 nm to 900 nm]. Further, one could consider a direct correspondence between the backlight cell, the liquid crystal cell, and the phosphor cell, whether addressed actively or passively.

(xii) Liquid Crystal Printing

It is possible to consider printing the liquid crystal directly into another well structure that corresponds with the phosphor well structure. Consideration needs to given to the edge properties of the liquid crystal in terms of surface wetting/surface electrical potential affect on crystal rotation angle and the impact of high shearing forces present with conventional ink jet methods. Liquid crystal are sensitive to this issue. A method to reduce such issues is based on pressure impulse direct contact transfer, which is the pressure impulse displacement of the liquid meniscus in the nozzle to a point where the meniscus surface just touches the substrate surface whereupon the surface tension-surface energy relationship causes the meniscus ligament to constrict under the action of the wetting of the liquid on the surface.

A number of the above outlined areas are also applicable to conventional active matrix liquid crystal displays [AMLCD's] and hybridised variants of liquid crystal displays.

Organic or polymeric conductive tracks may be deposited for connection to an electroluminescent or light emitting polymer display. Insulating structures which act to space components of the display may be deposited using drop on demand printing; For use with a field emission display, the insulating structure may have two key properties, namely having a secondary electron emission of less than or equal to 4 and a surface sheet resistance in the range $10^9$ to $10^{16}$ Ohms per square.

An electroluminescent display may be formed with an integral focusing organic or inorganic lens system. A lens may be deposited on each pixel of the display so that the displayed image may be viewed on a windscreen, visor or other such surfaces.

Thus, the present invention also provides a means of forming a non-intrusive, transparent displayed information on a screen that can be used in all aspects of life, including, but not restricted to, helmet visors, opthalmic and protective glasses, sunglasses, car windscreens, aircraft windscreens and observation portals, mirrors, and displays initiated when emergency arises to provide an escape route and emergency procedure data. This invention enables the cheap deposition of displays onto a wide variety of products to facilitate access to IT messages and other information.

Preferably, the device comprises a plurality of portions comprising respective layers of a multi-layer display device.

Preferably, the display comprises at least one electrically active display pixel, at least two adjoining portions of the or each pixel being formed from one or more different deposition materials.

Printing materials include, but are not restricted to:
conjugated polymers (eg, MEH poly(phenylene vinylene);
polythiophene; and
polyacetyllene derivative.

The display element can be based on a pale yellow colour (which can be provided by the deposition of polyaniline) as the neutral transmission colour, which colour changes to provide the necessary contrast for information transfer to the eye. For polyaniline multiple colour changes occur at different electrode potentials in the range −0.2 to −1.0 volts (taken with respect to a standard calomel electrode). The colour varying from yellow, through green to dark blue. Polyaniline is usually operated at below the second oxidation potential, thus providing one colour change from pale yellow to green.

Lens design can be achieved using a single or multiple materials that influence the light output for the x- and y-axes, thereby providing control over the collimation of the light and hence of the potential intensity that can be achieved at a given point. A typical example of this would be the integration of such a device on to an ink jet printhead to facilitate localised radiation exposure of ejected droplets where the light source is associated with a single nozzle and as such is addressable.

The lens may take the form of a "frog-eye" lens. The deposition process can be applied to the formation of a random array of variable geometry hemispheres of the same or differing material to form what are termed "frog-eye" or "moth-eye" lenses. The computer generated structure, based on specific refractive index data, may create an image of the required lens structure that is then printed using a deposition technique.

Lenses may be deposited on a wide variety of surfaces. In one example, a lens may be deposited on a solid state semiconductor or light emitting diode device or device array. Drop on demand printing may be used to form the exit window lenslet to influence the focusing of the emitted light from both inorganic and polymeric laser structures and light emitting diodes, including LED display arrays. In another example, a lens may be deposited on a display surface, such as a colour television screen, computer screen, lap-top computer screen, camera display screen, or fixed or hand-held games console display surfaces for providing a means of viewing such information in 3-D. The printed optical element(s) can provide a means of modifying the optical pathlength of the information being image on the eyes of the observer such that the brain of the observer interprets the information as a 3-D image.

The method may further comprise the step of depositing an anti-reflection coating over a display device. The anti-reflection coating may incorporate at least one of scratch resistance, water permeation and dielectric isolation. The coating may be formed from an ormocer, such, as for example, a siloxane.

The method may further comprise depositing an adhesion promoting layer on to said surface prior to the deposition of said display device. The adhesion promoting layer may be either conductive or insulating, as required.

The method may employ at least one printhead attached to a robotic arm to deposit said droplets. By using a robotic arm having a high degree of freedom, a planar flat panel display may be deposited on a wide variety of flat and three-dimensional surfaces, such as curved windscreens on automobiles.

A lenslet array or a lenticular lens structure may be deposited on the surface of the display to provide three-dimensional display effects.

The present invention also provides a method of forming a correcting lens element on a transparent blank for opthalmic applications using the technique of drop on demand printing to deposit droplets of deposition material, said method comprising depositing a plurality of droplets on said blank to form said element. Diffractive lenses such as single and multiple slits, circular apertures, hole or line arrays, rectangular apertures, opaque obstructions, in 2-D or 3-D formats, for influencing the transport path of light (deviation from rectilinear propagation) may be deposited on a blank ophthalmic substrate material. The blank may be formed from material include glass and transparent plastics in planar or complex 3-D shapes.

The present invention also provides a method of forming an anti-reflection coating using the technique of drop on demand printing to deposit droplets of deposition material, said method comprising depositing a plurality of droplets on a surface to form said coating. The surface may be an opthalmic lens. Specific physical structures can be applied to a surface so as to interfere with the light in such a way as to provide an anti-reflecting property for the wavelength of light of interest. Such features will vary dependent upon the wavelength of light and are also required to vary in three dimensions, for example, due to the wavelength band 290 nm to 880 nm.

The present invention also extends to a method of forming an anti-fogging coating using the technique of drop on demand printing to deposit droplets of deposition material, said method comprising depositing a plurality of droplets on a surface to form said coating. Drop on demand printing may be used to dispense a low surface energy liquid on to a surface to inhibit moisture uptake and hence fogging that restricts vision. Such a low surface energy coating may also inhibit particulate uptake reducing the frequency with such surfaces need to be cleaned. Typical deposition materials include perfluorocarbons. Typical surfaces include ophthalmic lenses, car windscreens, visors and display covers.

The present invention also extends to a method of forming a photochromic array using the technique of drop on demand printing to deposit droplets of deposition material, said method comprising depositing a plurality of droplets on a surface to form said array. Drop on demand printing may be used to deposit a variable thickness and hence colouration rate and density of organic, inorganic or hybrid organic-inorganic material on to a surface, such as an ophthalmic lens, the gradation being from top to bottom so that not all of the lens or visor is reduced in light transfer to the same extent or in the same photochromic response time frame. The gradation may be achieved by 3-D multiple layer build-up.

The present invention also extends to a method of forming a "fractal network" photoemissive device using the technique of drop on demand printing to deposit droplets of one or more different deposition materials. The droplets may interact either at the surface or in-flight to form the interpenetration associated with the said "fractal network" throughout the deposited material or at selective depths therein.

The fractal networks are so designed as to provide greater charge transfer and electron-hole collection efficiency throughout, for example, the active polymer layer. The creation of double heterojunctions can be facilitated with this printing techniques The present invention also extends to a method of forming a wound-controlling device using the technique of drop on demand printing to deposit droplets of deposition material, such as liquid, gel, resin or gum, said method comprising depositing a plurality of droplets on a surface to form a wound-controlling device.

It is known that polyethylene-based surface wound treatments exist that provide much faster wound healing for $3^{rd}$ degree burns and other similar wounds, such as pressure or bed sores. Novel bioactive wound dressings have been developed by Professor Shlomo Margel [Bar-Ilan University, Israel]. These dressings are composed of cellulose dressings covalently coupled with proteolytic enzymes e.g., trypsin [which cleanses purulent-necrotic wounds], lysozyme [which dissolves bacteria cell walls], collogenase and hyaluronidase [which decompose collagen and hyaluronate, respectively, thereby preventing the formation of rough scars]. Professor Margel covalently coupled the proteins to the cellulose surface via a novel immobilisation method.

Drop on demand printing can be used to deposit such materials on to wounds using an ink jet-based spray or single nozzle or linear array application to effect a thinner, much more uniform and hence controlled wound healing process. Proteins may be reacted to the cellulose surface directly at the wound, thereby further increasing the hygroscopicity and activity of the coupled proteins.

The concept includes other forms of artificial skin and surface treatment for wound coagulation and healing, including thermoset and thermoplastic hydrogels, hydrocolloids, foams and films. Polymers of particular interest in medicine include, but are not limited to, polyvinyl chloride, polyethylene, polystyrene, polypropylene, and polyethylene terephthalate.

This aspect of the present invention also extends to the deposition of a liquid treatment on to a damaged or diseased organ. Drop on demand printing can provide controlled selective area dispensing of a drug or medicinal treatment to an internal organ site using the imaging performance of an endoscope that houses a nozzle and local piezoelectric actuator at the tip for delivering the prescribed treatment. The localised printing of the treatment drug(s) can limit the impact of toxicological reaction with the body, whilst enhancing the medicinal benefit of the drug(s) using a much reduced concentration resulting from targeting the diseased cell or exposed wound. Liquid chemicals may be mixed at the microlitre to sub-picoliter level.

The present invention also extends to a method of forming an organic sensing or actuating device for monitoring stimuli reactions using the technique of drop on demand printing to deposit droplets of deposition material, said method comprising depositing a plurality of droplets on a surface to form said device. An intelligent polymer or inorganic logic device can be formed on an adhesive substrate that can then be fastened to the skin of a patient. The printed device may also includes an electrically controlled biological or artificial membrane that controls the release of a drug into the cone needles that prick the skin upon fastening application and thus allow the drug to enter the blood stream via diffusion. Such a simple device may be printed directly onto a patient's skin. Such a device could be a polymer transistor array that provides the necessary control logic and which can be interrogated using an rf based remote circuit (similar to electronic tagging).

Monitoring circuitry may be built into the device: In this case the circuit could be powered directly by a thin film battery. The monitoring can also include potential difference changes at the cone needles used to introduce the drug. The observed potential difference, remote from the place of drug injection, can be used to determine the rate of drug transfer.

Features other than devices may be formed directly on human skin. Fluorescing inks may be printed using a portable ink jet printhead on to human skin in order to provide an invisible coding that can be removed by washing or by wear and tear within a specified period. This technique may also be used to provide visible and novelty short delay (few days to few weeks duration) tattoos for decorative purposes.

The present invention also extends to a method of forming a protective coating for dental applications using the technique of drop on demand printing to deposit droplets of deposition material, said method comprising depositing a plurality of droplets on a surface to form said coating. Currently tooth in-fill polymers, that are UV curing, are forced into cavities using brute strength. Drop on demand printing can be used to controllably administer the required in-fill quantity in a more reproducible and material efficient manner. Each droplet can be cured as the next droplet is being fired in to the cavity. A variety of wound treatments and catalytic or other additives could be introduced in-flight by using two or more nozzles that are co-incident on the cavity being treated. Hard wearing transparent protective coatings can also be efficiently printed on to capped or naturally occurring teeth that have not need treatment but would benefit from a protective coating.

The present invention also extends to a method of forming a synthetic micromuscular skin material using the technique of drop on demand printing to deposit droplets of deposition material, said method comprising depositing a plurality of droplets on a surface to form said skin material. Such materials may be printed in an array to form an active tactile array.

The present invention also extends to a method of forming an organic or hybrid organic-inorganic correction lens on to the surface of an eye using the technique of drop on demand printing to deposit droplets of deposition material, said method comprising depositing a plurality of droplets on the eye to form said lens. Drop on demand printing can provide a means of printing a corrective lens directly on to the eye. Specialist materials are required that cater for eye fluid interaction and that compensate for minor optical aberrations during the life of the printed lens (expected life to be 1 year +).

The present invention also extends to a method of forming a surface energy controlling coating on a surface using the technique of drop on demand printing to deposit droplets of deposition material, said method comprising depositing a plurality of droplets on said surface to form said coating. Drop on demand printing can be used to selectively deposit a non-wetting or surface energy controlling compound on to a surface, such as a car headlight, in order to control the removal of water from the headlight surface and to minimise the adhesion of road dirt in order to keep the light output at an optimum. The printed pattern can be such as to influence the flow path into removal ducting at strategic positions around the headlamp structure.

The present invention also extends to a method of forming a corrosion resistant coating on a surface using the technique of drop on demand printing to deposit droplets of deposition material, said method comprising depositing a plurality of droplets on said surface to form said coating. The coating may be a single-layered or a multiple-layered coating formed on a hybrid or semiconductor device. For example, a corrosion resistant liquid, such as the low surface energy material designed by the American Naval Laboratories for protecting ships, may be deposited in order to protect against moisture and organic attack.

In one embodiment, a lens is deposited on the surface of a headlight casing. The lens can be printed on the inside of the sub-assembly or on the outside of the finished article when it has been mounted on the vehicle. Examples of lens structures include, but are not limited to, Fresnel Zone Plates, geodesic lenses and lens arrays.

The present invention may also addresses various security issues, such as printing a computer defined interconnection on to a set of print circuit cards that are matched in such a way that no other cards can be inserted in their place or in the wrong sequence, and the manufacture of polymeric/organic-based fingerprint sensing tactile structures onto a surface. The structure is based on capacitive or resistive changes at electrode cross-over positions (neural node array—neural network). The device may be built-up from a number of printed layers. The manufacturing method may be single side planar based and include the ability to use buried interconnect and microvia interconnection techniques using organic or inorganic materials.

Microvias are routinely used in printed circuit applications where one requires to interconnect between circuits that are laid one on top of the other, making use of an interlayer dielectric isolation. Conventionally holes (microvias) are machined in the interlayer to provide access to the upper and lower circuits or devices or conductors. A suitable in-fill material (conductive, semiconductive, insulating, dielectric, etc.) is employed to provide a connection between the two components using the machined hole as a conductive conduit. Ink jet printing provides a means of achieving such microvias by printing discrete areas of material, such as an interlayer dielectric on top of a metal contact, leaving holes at strategic positions. A second printhead may then be employed to in-fill the printed holes with an appropriate material. A third printhead may then be employed to print a top conductor or other feature on to the in-filled hole (microvia).

An alternative is that due to a voltage output sensed from a piezoelectrically actuated thin film structure, element, device, array, or feature. This capacitive element may have tactile accentuating structures printed on the top contact that enhances the sensitivity and resolving power of the sensing array. The manufacturing method may be as defined above but also include the printing of the metal contacts and environmental protection layer to minimise/eliminate mechanical cross-talk.

The present invention also extends to a method of forming a surface catalyst using the technique of drop on demand printing, said method comprising the step of depositing a plurality of droplets on a surface to form said surface catalyst. In one preferred embodiment, the surface catalyst comprises a compound which chemically reacts with either a liquid source of metal (copper sulphate-like solution) or a gaseous source of metal (Cu[TMVS]hfacac (Hexafluoroacetylacetonate) Cu (vinyltrimethylsilane) to leave a patterned thickness of, in this case, copper metal, a microvia circuit, for example, being built-up of selectively plated metal and ink jet printed interlayer dielectric deposition. This can provide a highly efficient and cheap method of printing high end, high added value printed circuits on to a wide variety of surfaces. It has application to rigid plastic or inorganic (including ceramic) substrates, single crystal wafers, and flexible plastic, glass, and single crystal substrates.

The present invention also extends to a method of forming a surface wetting layer on a surface using the technique of drop on demand printing, said method comprising the step of depositing a plurality of droplets on a surface to form said wetting layer. Drop on demand printing can be used to create regions on a surface that are wetting and non-wetting. The printing of a perfluorocarbon liquid, such as Flutec, or liquid PTFE (Du Pont product) can provide a means of defining a surface with an energy in the range 6 to 36 mN m$^{-1}$. Other fluids induce surface wetting such as HMDS and other siloxane derivatives, thereby providing a total range of surface energies from 6 to 76 mN m$^{-1}$.

The present invention also extends to a method of forming a chemically decomposible layer on a surface using the technique of drop on demand printing, said method comprising the step of depositing a plurality of droplets on a surface to form said decomposible layer. The layer may decompose under the action of heat or electromagnetic radiation. Drop on demand printing can be employed in the manufacture of a thin film (thickness less than or equal to 3 microns) ink jet printhead, providing a method of directly patterning the piezoelectric or electrostrictive or relaxor thin film ceramic (or other materials) actuators. The liquid source materials are similar to those used in the manufacture of ferroelectric electro-optic waveguiding structures, i.e., sol-gel solutions based on materials such as lead acetate, ethoxyethanol, M-n-butoxide (M=metal e.g., Ti, Zr, etc.), M-isopropoxide, etc.

It is possible to use the ink jet printing method in conjunction with a heated substrate to induce rapid crystallisation of a thin layer in-situ, the solid content (less than or equal to 25 wt %) of the drop being adjusted so as to provide a thin film that does not crack or craze during the rapid crystallisation process. The required layer thickness can be then achieved by performing multiple passes of the required device layout, thereby building-up the actuator as a multiple structure. Additional solid-state interlayers can be achieved, if required, using external radiation-based annealing methods, such as thermal annealing, rapid thermal treatment (RTP), or laser recrystallisation. Typical thin film applications include, but are not limited to:

Integrated area active matrix thin film printhead—single side planar build
Integrated linear active matrix thin film printhead—single side planar build
Intercavity fluid transport—piezoelectric Lamb wave excitation
Printed microactuator—magnetic composite
Printed microactuator—reversibly swelling electrogels
Selective area ferroelectric device printing on to a wafer-scale integrated component
Whole area coatings The process described can also be considered as a more accurate version of spray pyrolysis with the added advantages that precise liquid metering can be achieved and selective area coating is possible by selecting one or more nozzles from the array.

The present invention also extends to a method of forming a low friction material structure using the technique of drop on demand printing to deposit droplets of deposition material, said method comprising depositing a plurality of droplets on a surface to form said structure. This technique can be used to form an extended nozzle annulus adjacent to a planar nozzle exit in order to limit nozzle plate wetting. Liquid PTFE or other suitable low coefficient of friction material (i.e., fluoropolymers in fluorosolvents, acrylates, epoxies, urethanes, celluloses, silicones, etc.) can be employed for the printing of the nozzle extension. Moreover, the same material can be used to form runners to guide a nozzle shutter plate. Suitable materials include, but is not limited to, PTFE, poly(ethylene-co-chlorotrifluoroethylene), and poly(dimethylsiloxane) [PDMS].

The present invention also extends to the deposition of adhesives using the technique of drop on demand printing to deposit a plurality of droplets of adhesive material. Thermoplastic and UV curing acrylate systems are types of adhesive that may be required to be printed in specific patterns on to a wide variety of surfaces and material types. Such an adhesive might be a transparent polymeric acid, such as poly(2-acrylamido-2-methylpropanesulfonic acid), which can both serve as an adhesive and a polymer electrolyte.

The present invention also extends to a method of forming a three-dimensional text or graphics image using the technique of drop on demand printing to deposit droplets of deposition material, said method comprising depositing a plurality of droplets on a surface to form said image. The images may be printed on:

a compact disc;
cosmetic packaging;
a medicinal product; or
a computer screen.

A 3-D printed image may provide a wide degree of aesthetic quality to a label, as well as providing a highly flexible medium for enhancing the advertisement potential of the product being sold. The image may consist of a full colour printed segment (dots), as well as, optically transmissive, transparent, or translucent segments (single layer or multiple layer) that introduces an optical aberration to the viewed graphic or image, and decorative metal elements or features.

The text or graphics image may be printed on to food, such as chocolates, cakes or any other form of confectionary. If so, it is preferred that the deposition material is a plain or coloured sugar icing solution. This can make assist, for example, in the identification of individual types of chocolate in a box of assorted chocolates. Alternatively, the deposition material may be chocolate (plain, milk or white).

The text or graphics may be printed on to the cover of books, magazines or the like. The use of drop on demand printing methods, amended for 3-D image printing, to print logos, advertising media and text/graphics on to a wide range of younger children's printed media can provide attractive and informative features for younger children. For example, the image may be fluorescent or luminescent.

In another alternative, the image is a three-dimensional photograph. The concept here is to introduce selective area height in to a standard colour image to introduce some degree of depth-of-field to the image being viewed. Consider a lighthouse against a blue sky back ground. The real 3-D image is translated on to a 2-D medium (paper, card, etc.) with a concomitant loss of information. If two identical pictures are taken and the second picture has the lighthouse cut out of it and stuck on top of the lighthouse in the first picture then it is possible to realise a simple 3-D photograph. Even this crude picture conveys more information than it's 2-D equivalent.

A 3-D photograph can be conceived where the image can be accessed electronically, using a suitable software package, so as to define those areas that require different heights thereby providing an image that has a constantly variable height in the range 1 μm to 1000 μm. It is possible to image this happening at a dot resolution >360 dpi. An advertising example is the 3-D imaging of a brand name on a drinks can or perfume bottle, where the printing is applied at the end of the manufacturing line on both flat and curved surfaces. It is also possible that such images could provide other functions such as "slow-release perfume scent" in the case of the perfume bottle or a "textured finish" in the case of the drinks can. In determining whether the idea of 3-D printing for optical information communication [nasal sensing is additional but not limited by need to visually identify feature] or visual stimulation effect is a practical idea one needs to understand the potential feature resolving power of the human eye. The usual method determining the resolving power of the eye is based on the "Rayleigh Criterion". Rayleigh's criterion suggests that one agrees to call the patterns being observed distinguishable when the first minimum of one falls on the central maximum of the other (or better). When the pupil is small the resolving power of the eye is about $10^{-4}$ radians of arc. This controls the minimum separation of points that are to be distinguishable: one can "just resolve" points 0.1 mm (100 microns) apart when they are 250 mm from the eye. This would reduce to about 40 microns at a viewing distance of 100 mm. Assuming that the resolving power applies for both height variation at a single point (plane of observation changed), as well as, width separation between two points at a constant or variable height to each other, the resolving power potentially places a limit on the printing resolution required for visual identification. "Just resolved" means the situation where the diffraction pattern from each separate feature spaced 100 microns apart interact in such a way as to cause the first minima of the first diffracting feature corresponds with the central maxima of the second feature and vice versa. So two dots printed at a spacing of 100 microns should just be resolved as two separate dots at a distance from the eye of 250 mm.

The typical printing resolution of a binary printhead is 180 dots per inch (dpi). 180 dpi equates to a dot centre-to-centre pitch of 140 microns. This would mean that a 40 micron diameter dot on this centre (separation between dot centres is 100 microns) would just be resolved at a distance from the eye of 250 mm. This would imply that a photograph of a face made up of dots at 180 dpi could be resolved as a discrete set of dots at a viewing distance of 250 mm. Changing the height of each dot separately between 1 micron and 100 microns would also be resolvable (3-D spatial resolution—off-normal viewing angle) for the same reasons as cited above with the exception that incident light level and direction will influence the edge definition of the feature being viewed. For the standard distances of viewing their is little point in changing the height variation by less than 40 microns as the eye cannot resolve such a change. However, changing the height in the range of 40 micron steps to 320 microns would provide a possible 8 levels of identifiable information. With suitable lighting a height variation of 300 microns could be resolved at a viewing distance of about 750 mm and a 500 micron height resolved at 1,250 mm. This would facilitate the printing of a 3-D advertisement display for a supermarket or High street store, where closer examination would reveal further information.

An electrostatic spray head may be used, in any of the above embodiments, to deposit said deposition material.

The apparatus which may be used to deposit the deposition material is a module that provides precision control over the ejection of a drop of fluid (metal precursor—organometallic, specialist fluid, etc.), controlling the jetted drop properties in-flight and on the substrate surface in real-time. An integral part of the jetting module is a suitable deflectable radiation source [solid state semiconductor laser—single or multiple wavelength electronically selectable] for conditioning the substrate surface and converting the fluid into the desired solid form. The laser system may house an integrated electronically activated light shutter (liquid crystal or electrochromic light valve). The module may have an integrated electronically activated mechanical shutter [bimorph driven micromachined structure] for controlling the protection of the fluid in the nozzle from the surface conditioning and solidification radiation source(s). A further refinement of the jetting module is to incorporate real-time drop presence imaging (RT-DPI) to facilitate a high processing yield by ensuring that a drop is printed where it is required. The imaging facility is a single pixel silicon photocell imaging array, the array geometry being so defined as to match the nozzle spacing and the expected solidified dot size.

The size of the printhead may be as wide as the surface to be printed. The printhead may house banks of nozzles of different diameter fed from the same fluid precursor reservoir or from a set of reservoirs housing different fluid types.

The solid state semiconductor laser solidification source may be rotatable (piezoelectric shear, etc.) in the plane of the drop ejection so as to ensure a constant irradiation intensity through-out the flight of the drop. The laser output may be discrete, serving individual nozzles, or may be a linear array of outputs that are imaged through a close-coupling lens to form a high intensity line which is the width of the printhead. In this instance whether the laser output is discretised or focused into a linear line the carrier for the laser array may be rotated as a whole and individual or banks of laser output may be pulsed or continuously driven to provide the necessary irradiation profile.

The nozzle plate shutter assembly may be so constructed as to afford close-coupling to the nozzle plate so as to provide a means of sealing the nozzle outlet from its surrounding atmosphere. One design makes use of an extended nozzle profile with adjacent guard rails. The nozzle plate uses the guard rails as a runner arrangement to ensure smooth and precise deflection operation.

The module may be operated in a fashion that requires the use of a complex drop ejection switching sequence. This is to ensure that the following sequence is implemented (operation not limited to this sequence):
(i) Energise bimorph shear to deflect shutter to expose nozzle outlet
(ii) Energise pressure impulse engine to eject fluid drop
(iii) De-energise shutter to seal/clean nozzle exit
(iv) Energise solid state semiconductor laser (or electronic light valve shutter)
(v) Energise shear action rotation to track eject drop
(vi) De-energise light valve and shear action laser array rotation to facilitate fly-back to start sequence over.

Preferably, the plurality of droplets comprise at least one droplet of one material and at least one droplet of another material.

The volume of each droplet is typically between 1 picoliter and 1 microliter. This enables the final shape of a device to be accurately controlled during the formation thereof, and enables a wide variety of different shapes of devices to be formed.

The present invention will now be described by way of illustration only and with reference to the accompanying Figures in which:

BRIEF DESCRIPTION OF THE DRAWINGS

FIG. 3 shows a cross-sectional view of a deposition head in combination with a UV light source;
FIG. 4 shows a cross-sectional view of a resistor;
FIG. 5 shows a selection of profiles for a resistor;
FIG. 7b shows a cross-section along line A—A in FIG. 7a.

Referring to FIG. 1 a three-dimensional electronic circuit element electronic device or other feature discussed above is formed on a printing surface using a drop-on-demand deposition technique to drop multiple droplets 20 of a deposition material from a number of deposition heads 22A, 22B, 22C. The deposition heads have a height above the printing surface between 5 µm and 1000 µm. Each deposition head 22A, 22B, 22C holds the deposition material and ejects it a droplet at a time on demand onto the print surface. The deposition materials may comprise in excess of 40% solid matter and may be any one of the materials discussed in the introduction.

Each deposition head comprises a pressure generation cavity 26 with a profiled cylindrical nozzle 28 in one wall of the cavity and a PZT bimorph actuator 30 in an opposite wall. Each nozzle 28 defines a line of ejection which is representative of the path a droplet of deposition material will take upon ejection.

Figure 1:
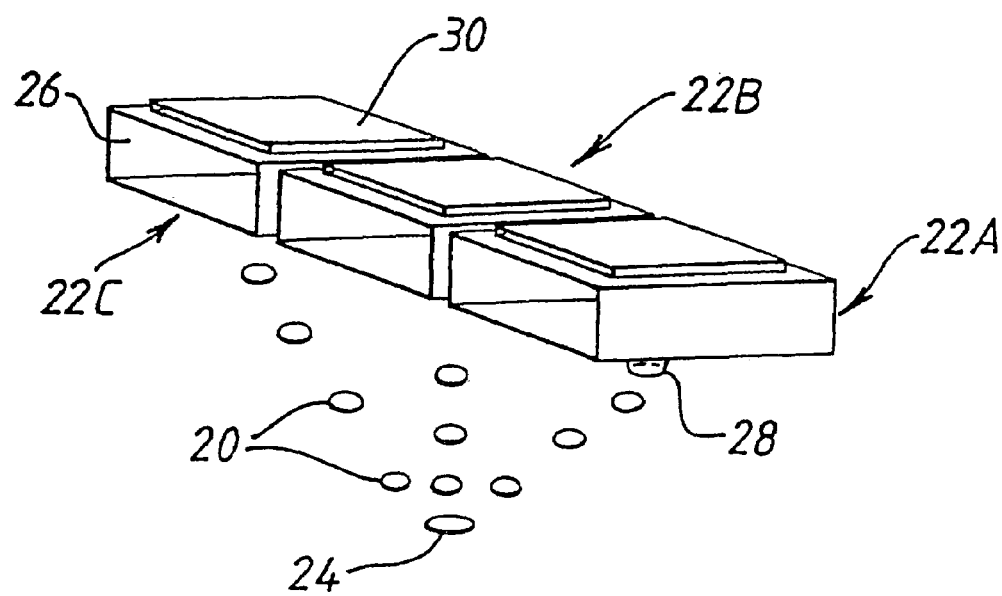
FIG. 1 shows three deposition heads directed towards a coincident drop site on a print surface.
Figure 2:
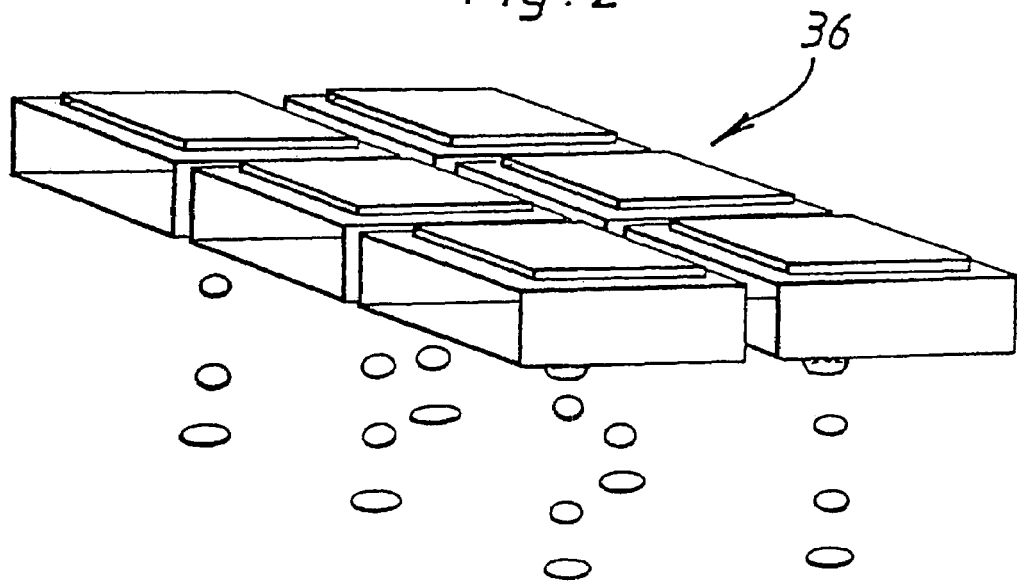
FIG. 2 shows an array of deposition heads.

FIG. 1 shows three deposition heads directed towards a single drop site, although any suitable number of deposition heads may be used to form the desired circuit feature. Of course, each deposition head may be directed towards respective drop sites rather like a conventional printer head, as shown in FIG. 2. Such a two-dimensional array 36 may provide for the simultaneous deposition of multiple droplets.

FIG. 3 shows a deposition head 22 as part of a X-Y deposition system 50. The system 50 includes a quartz-halogen lamp 60 supplying UV light through an optical fibre 62 to the printing surface 64 onto which the droplets 66 are deposited. This system 50 subjects the deposition material to radiation treatment after it has been deposited for the purposes of curing the material or other processing.

The system 50 employs digital deposition servo drive motors for x-axis and y-axis transport motion. A replaceable polymer deposition head 22, along with its associated polymer reservoir cartridge(s) 68, resides on the axis drive carriage plate. Integrated into the carriage plate is a set of annular fibres that permit close proximity UV and infrared radiation for surface pretreatment, in-flight treatment and/or post deposition treatment. The annular radiation emitters are fed from a fibre optic 62 that is coupled at the opposite end to the light source 60. The deposition surface 64 may be electrostatically secured to the deposition frame. The use of a cooling fan 70 and cooling air directional ducting 72 maintains the system 50 at a working temperature.

The characteristics of the element to be produced are drawn on a computer screen using a suitable draw facility software package or are imported into the plotter drive computer memory using a digital scanning facility (with on board character recognition capability, as required). The finished map is digitised and the appropriate x-y co-ordinates are fed to the system interface so that the required element is formed at the location requested. The drive waveform to the droplet dispense pressure generator (polymer dispense head) is synchronised to the x-y placement co-ordinates, so that the required element is accurately placed. For specific surfaces it is possible to employ an adhesion enhancing liquid pre-treatment prior to depositing the required polymeric pattern.

Integral continuous or pulsed UV (also in conjunction with infrared radiation-thermally assisted curing) light source with illumination of the dispensing droplet via a fibre-optically fed focusing annulus may be located in close proximity to the dispensing head (or nozzle array). Note that in the limit (high value or high polymer dispense volume applications) this light source could be an excimer laser that employs a rotating mirror arrangement to create a fine line UV light beam that is continuously rotating around a selectable circular radius or more complex elliptical shape. The annulus can be formed by using a suitable retaining mould in the Y-spider plate, and with the use of a pre-shaped top casting cap, PMMA or alternative polymer can be injected into the unit for a UV transmitting annulus with a particular optical focusing. It is envisaged that a suitable light source can be manufactured that would enable the annulus to be fed from a source that is also integrated onto the y-axis carriage plate.

The shape and surface of the nozzle 28 determines the energy needed to eject the droplet from the nozzle. A polished nozzle 28 will have a lower surface energy than an unpolished nozzle and therefore will more easily release a droplet. A low surface energy nozzle exit can be achieved using a variety of liquid coatings (e.g. Montedison Galydene), however a more practical route is to gravure print a silicone loaded acrylic UV curing film on to the front of the nozzle plate (this exhibits a surface energy of less than or equal to 19 dyn cm (190 µjoules)). One advantage of using such coating materials is that the nozzle can be made of both copper (wetting) and laminate material (wetting or non-wetting) giving more flexible control over the direction of droplet ejection. Both materials can be obtained in a variety of metal and laminate core thicknesses.

The nozzle may incorporate an integral piezoelectric bimorph nozzle shutter (not shown) to act as a sealant for the deposition material retained in the nozzle. This feature prevents ultraviolet light and water vapour from entering the nozzle when not in use. The shutter may comprise a plunger retained in the deposition chamber of the deposition head. Such a plunger means has a relative coaxial sliding fit with the nozzle whereby a plunger head aligns with the nozzle aperture to close the nozzle and in an open position the plunger is retracted into the chamber. By controlling the position of the plunger head with respect to the nozzle aperture, the deposition chamber size can be controlled thereby allowing an adjustable droplet of deposition material to be ejected.

The nozzle may comprise means for directly varying the size of the nozzle aperture whereby the means is an iris type arrangement.

A deposition control electric field generator may be used to generate an electric field in the vicinity of the nozzle to control the shape of a meniscus of the electrically responsive deposit materials. This is used to exert a pulling force on the droplets so that less energy is required by the actuators to eject the droplets from the nozzle chamber.

Material may be dispensed in a vacuum to facilitate the deposition of droplets of diameter substantially less than or equal to 1 µm. If this were attempted in air then the drag induced by air resistance would distort the droplet and impair its dimensional stability and placement accuracy.

Examples of features formed using the technique of droplet ejection will now be described with reference to FIGS. 4 to 7. The materials from which the various layers and regions of the devices are formed are given purely by way of example.

Resistor

FIG. 4 is a cross-section of a polymeric resistor 200 formed on surface 202. The resistor 200 comprises an adhesion promoting layer 204 and controlled-resistance polymer 206 formed on the layer 204. The resistor 200 is connected to a conductive track 208 formed on the surface 202 by a polymeric electrical contact 210. An isolating layer 212 is formed over the entire surface of the resistor and the conductive track.

Variation in the height d, width w and length L of the resistor 200, that is, the volume of the resistor 200, controls the specific resistance value R of the resistor 200 according to the equation:

$$R = \frac{\rho \cdot L}{w \cdot d}$$

where rho is the resistivity of the resistance polymer 206. Of course, the solid content per droplet will influence the resistivity of the polymer 206.

The resistor 200 may take any three-dimensional shape as determined by the designer of the resistor in view of the intended purpose of the resistor. FIG. 5 shows top views of resistors 200A to 200D, and side views of resistors 200E to 200H. In addition, both of these profiles may be changed by sectioning the resistor following formation.

Electron and hole barrier reducing layers/interface doping can be used to enhance the functionality and stability of the resistor.

Capacitor

Figure 6:
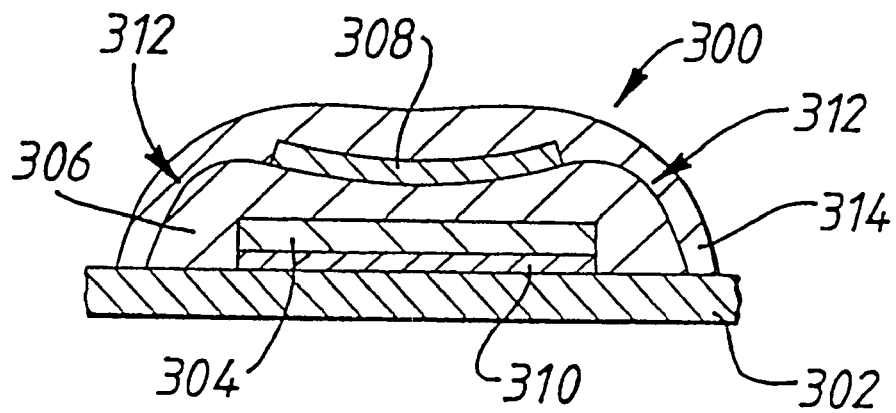
FIG. 6 shows a cross-sectional view of a capacitor.

FIG. 6 is a cross-section of a polymeric capacitor 300 formed on surface 302. The capacitor 300 comprises a first polymeric conductive layer 304, a polymeric dielectric layer 306 and a second polymeric conductive layer 308. The first conductive layer 304 may be deposited on an adhesion promoting layer 310; however, depending on the nature of the surface 302, this adhesion promoting layer may not always be necessary. As shown in FIG. 6, the edges 312 of the dielectric layer 306 are locally thickened in order to eliminate the electric field breakdown due to current bunching at the edges of the conductive layers. An isolating layer 314 is formed over the entire surface of the capacitor 300.

Similar to the resistor, the capacitor can take any shape as determined by the designer of the capacitor in view of the intended purpose of the capacitor. For example, the dielectric layer 306 may comprise a plurality of layers of different material aligned either substantially parallel to or substantially perpendicular to the conductive layers 304 and 308.

Inductor

Figure 7A:
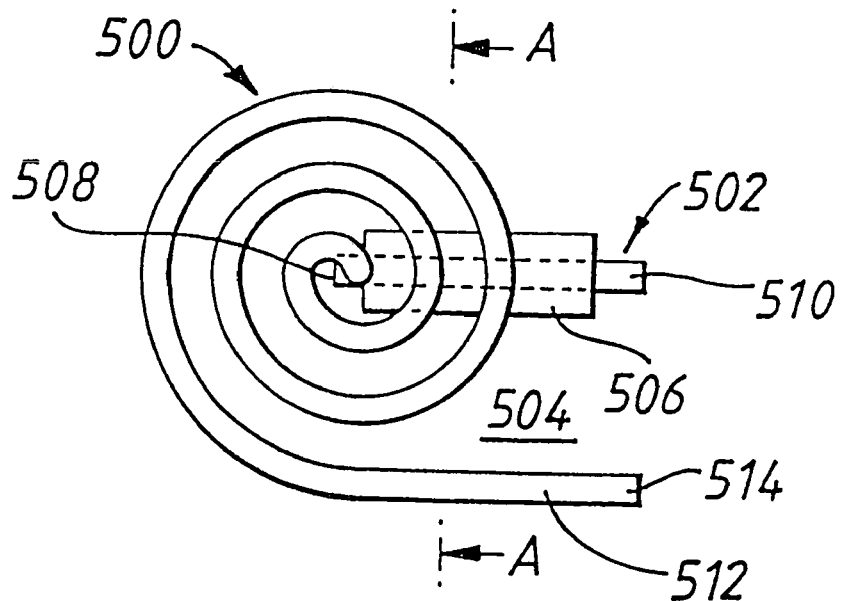
FIG. 7a shows a schematic diagram of an inductor.
Figure 7B:
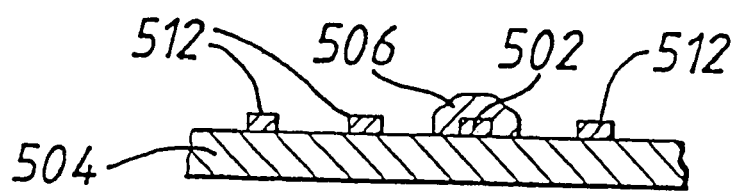

FIGS. 7a and 7b shows schematic diagrams of an inductor 500 formed using a droplet deposition technique. The inductor 500 comprises a first polymeric conductive layer 502 formed on surface 504. An insulator layer 506 is then deposited over the conductive layer 502 so as to expose contacts 508 and 510 of the conductive layer 502. A second polymeric conductive layer 512 is subsequently deposited in the form of a spiral having a centre coincident with contact 510 and an end 514 substantially aligned with the contact 512. The size of the inductance of the inductor is determined by the number of "turns" of the spiral 512 and the material from which the insulator layer is formed.

Transistor

Figure 8A:
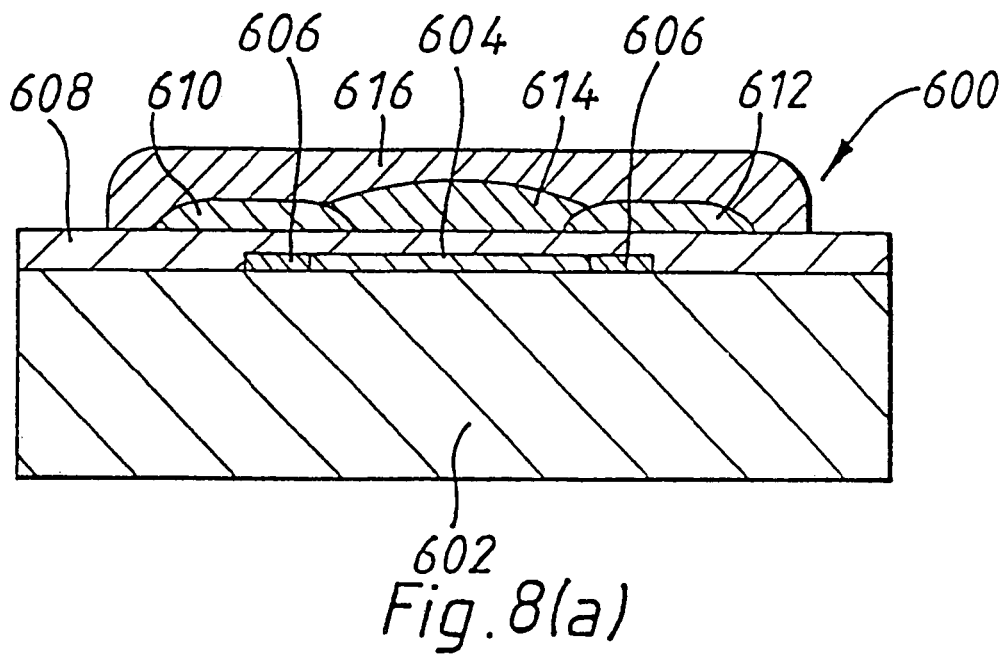
FIGS. 8a and 8b are cross-sectional views of a transistor.
Figure 8B:
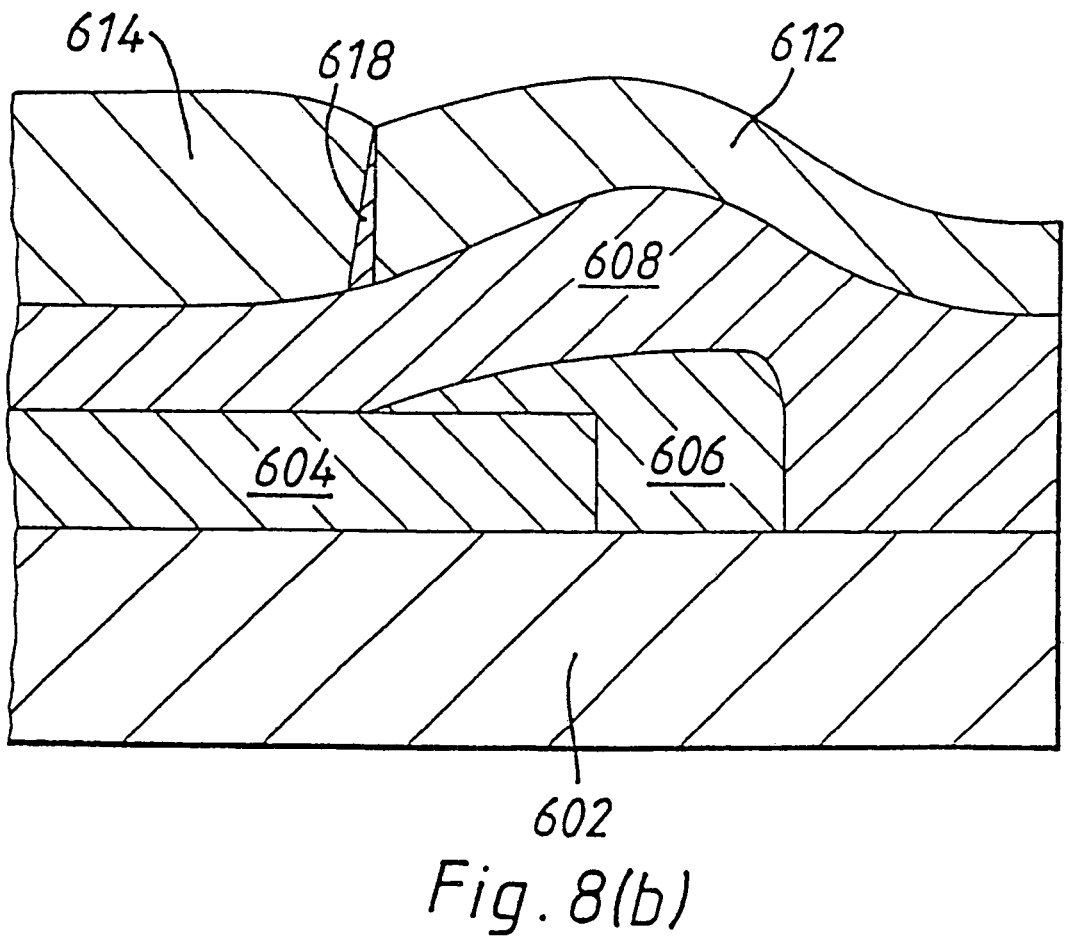

FIGS. 8a and 8b are cross-sections of a field effect transistor 600 formed on surface 602. The transistor 600 comprises gate region 604 formed from doped polyaniline or Cu [hfacac], gate region insulator spacer 606 formed from one of polyimide, PMMA or siloxane, gate insulator 608 formed, depending on the gate characteristics, from one of polyimide and siloxane, source region 610 formed from doped polyaniline or Cu[hfacac], drain region 612 also formed from doped polyaniline or Cu[hfacac], and active semiconductor region 614 formed from pentacene, preferably doped pentacene. A protective acrylate-doped ormocer or methoxysilane-based layer 616 may be formed over the surface of the transistor 600 to hermetically isolate the transistor 600.

The gate region insulator spacers 606 are shaped so as to control the electric field gradient E at the edges of the gate region 604 in order to minimise leakage current. The spacers 606 may take any desired shape, within the limits of droplet size and curing technique, that is, on the deposition technique used.

In order to control the barrier height, an interface layer 618 is formed on the facing walls of the source region 610 and the drain region 612 prior to the deposition of the active semiconductor region 614, and into which the semiconductor region diffuses during deposition and/or curing thereof. The interface layer 618 may be formed from TCNQ or a liquid equivalent.

Sensor Devices

Figure 9A:
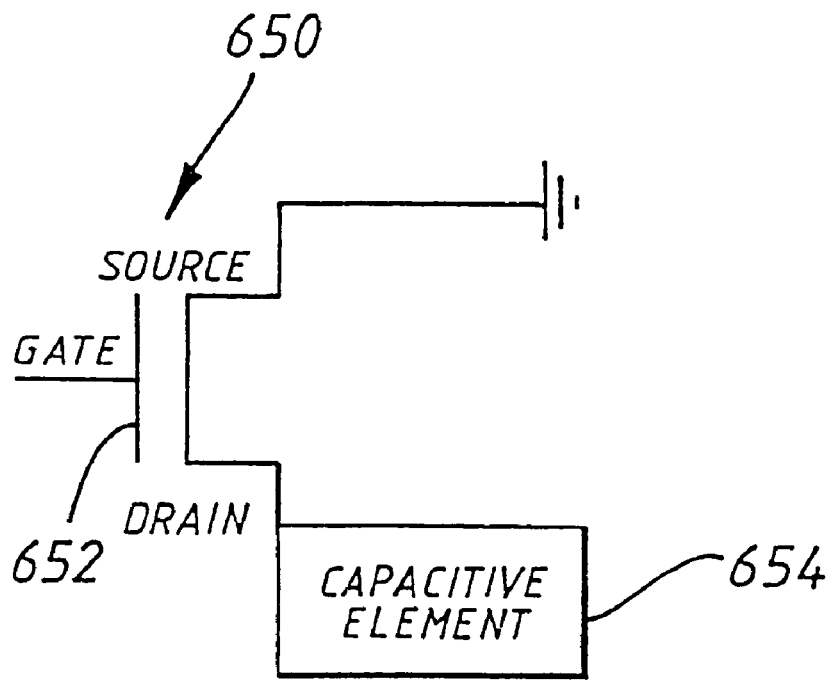
FIG. 9a shows a simple circuit for a capacitive sensor.
Figure 9B:
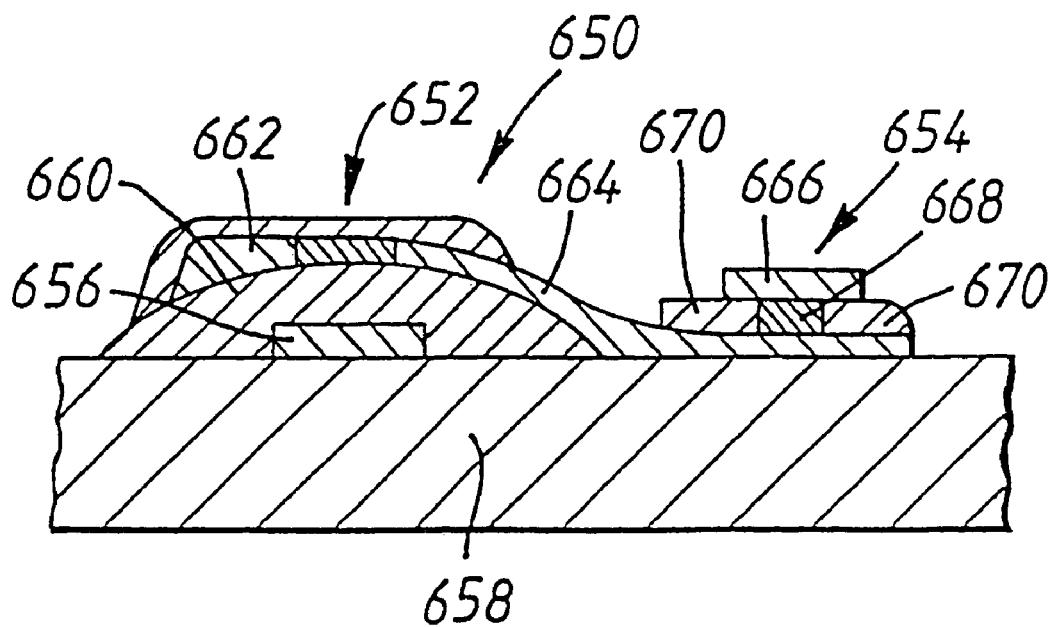
FIG. 9b shows a cross-sectional view of a capacitive sensor.

FIG. 9(a) is a simplified circuit diagram of a capacitive sensor 650. The sensor 650 comprises a transistor 652, which in the example shown in FIG. 9(a) is a p-FET transistor. The source of transistor 652 is connected to circuit ground and the drain of the transistor is connected to a capacitive element 654. FIG. 9(b) is a cross-section of the capacitive sensor 650. The transistor 650 is similar to the transistor 600 shown in FIG. 8(a), comprising a gate region 656 formed on substrate 658, gate insulating layer 660, source region 662 and drain region 664. The drain region is larger than the region 612 shown in FIG. 8(a), extending over the insulating layer 660 on to the substrate 658 so as to form part of the capacitive element 654. The capacitive element 654 further includes a conductive top layer 666, dielectric region 668 and insulting region 670. The sensor 650 operates by induced charging or discharging of the capacitor 654, for example, by touch, affecting the logic level of the transistor 652.

The plurality of sensors 650 may be formed in an array, comprising a plurality of rows and columns of sensors, so as to provide a capacitive sensor array.

Figure 10:
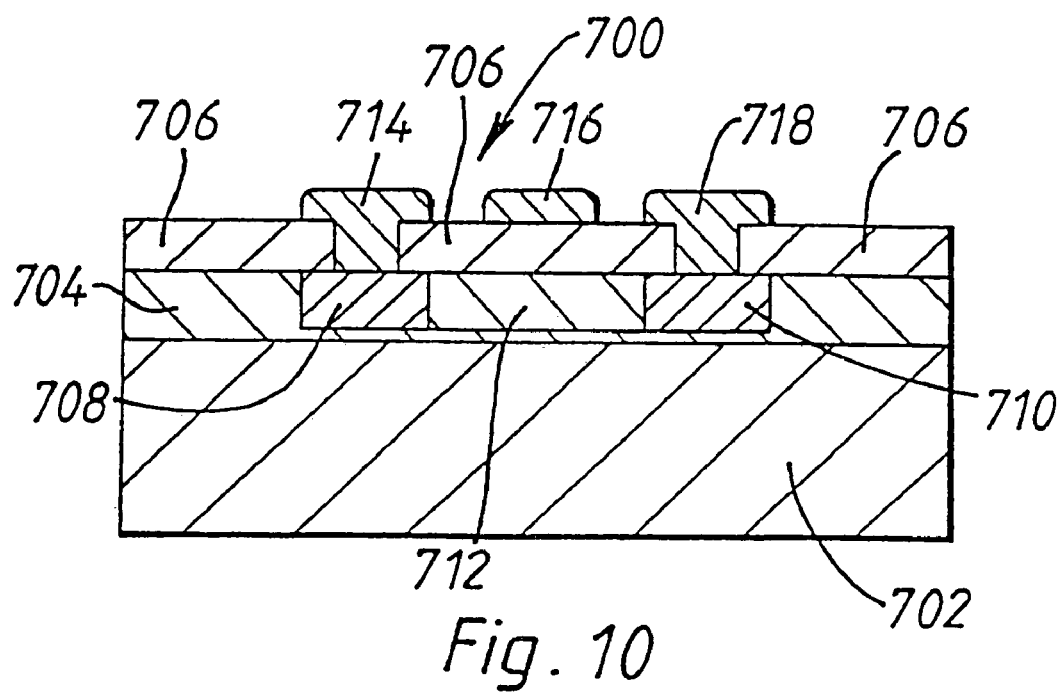
FIG. 10 shows a cross-section of a chemotransistor.

FIG. 10 shows a cross-section of an example of a device for sensing hydrogen. The device comprises a chemotransistor 700, which comprises a substrate 702, preferably in the form of a flexible plastics sheet, polymeric insulator layers 704 and 706 formed from one of polyimide, PMMA and siloxane, source region 708 and drain region 710 formed from n-doped polyaniline, active semiconductor region 712 formed from p-doped polyaniline, source contact 714 formed from doped polyaniline, porous gate contact 716 formed from polyaniline doped with one of $C_{60}$ or Cl, and drain contact 718 formed from doped polyaniline. All of the layers, regions and contacts 704 to 718 are formed by a droplet deposition technique.

Solar Cell

Figure 11:
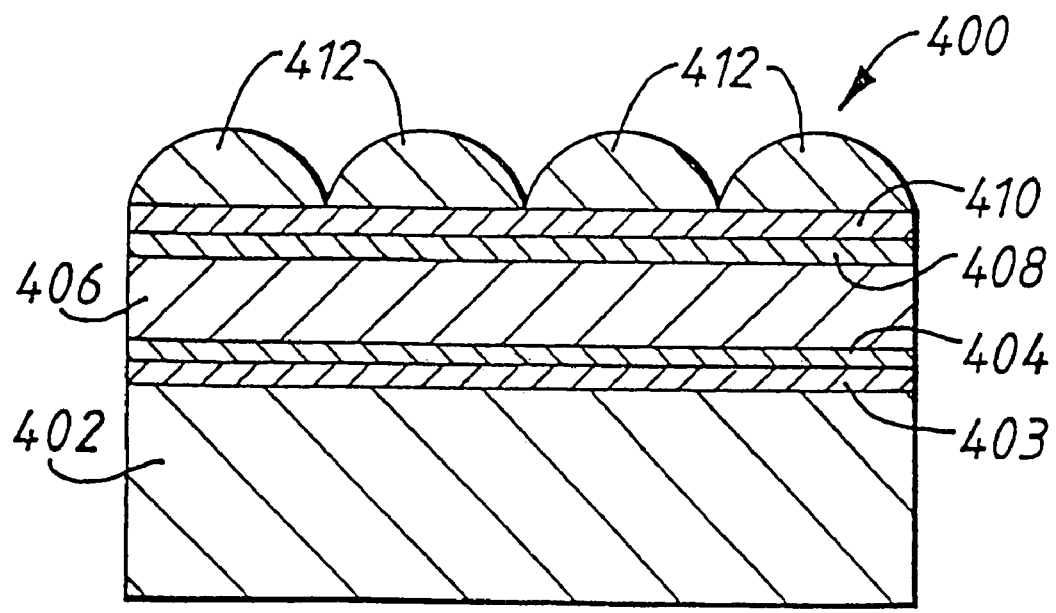
FIG. 11 shows a cross-section of a solar cell.

FIG. 11 shows a cross-section of a solar cell 400. The solar cell 400 is formed on a substrate 402, preferably a plastics sheet 402. A prelaminated aluminium layer 403 is pre-formed on the substrate 402. Alternatively, layer 403 may comprise a deposited layer of polyaniline with a layer of TCNQ for injecting electrons deposited thereon. A layer 404 of $C_{60}$ doped PPV is deposited on layer 403, and a layer of intrinsic material 406, such as octaethylporphine, is deposited on the layer 404. Layer 408 of a p-type polymeric semiconductor material, such as OOPPV, and layer 410 of a transparent conductor, such as polyaniline, are subsequently deposited. An array of microlenslets 412, preferably formed from an ormocer, for maximising the light collection efficiency of the cell are then deposited on the layer 410.

Display

Figure 12A:
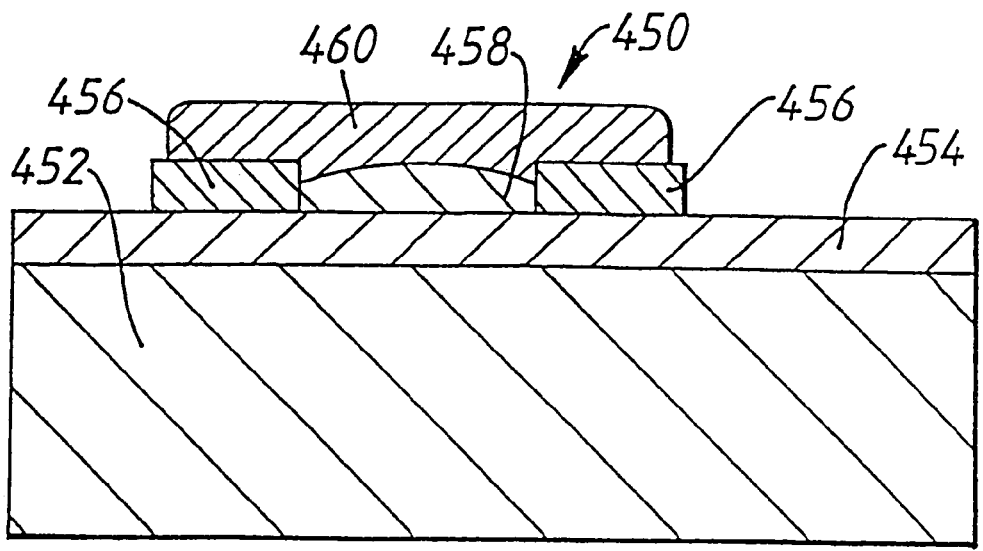
FIG. 12a shows a cross-section of a display pixel.

FIG. 12(a) shows a cross-section of a display pixel 450. The pixel is formed on a substrate 452, which may be either rigid or flexible. A suitable flexible substrate is poly[ethylene-terephthalate] (PET). The pixel comprises a reflective base contact layer 454, which may be formed from aluminum or Cu[hfacac]. Upon layer 454 are deposited isolation insulators 456, formed from one of polyimide, PMMA and siloxane, an active polymeric electroluminescent region 458 formed from a PPV derivative and a transparent ormocer or polyaniline top contact 460.

Figure 12B:
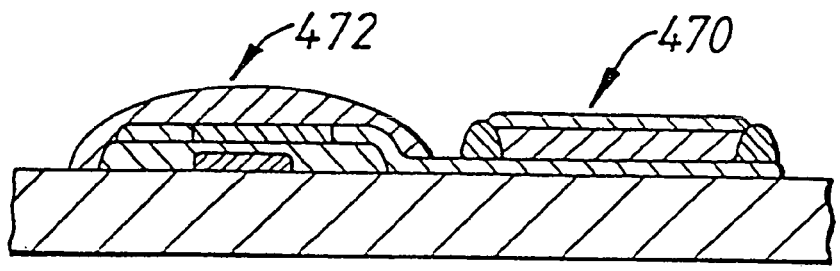
FIG. 12b shows a cross-sectional view of a display pixel and switch.

FIG. 12(b) shows a cross-section of a display pixel 470 formed on an active switch. In the embodiment shown in FIG. 11(b), the active switch includes a transistor 472, similar to the transistor shown in FIG. 8. The transistor 472 is first deposited on the substrate to form the active matrix backplane. The display pixel containment wells are then printed adjacent to the switching transistor, the geometry of the containment being such as to optimise the effect of surface wetting and planarised in-fill.

Figure 12C:
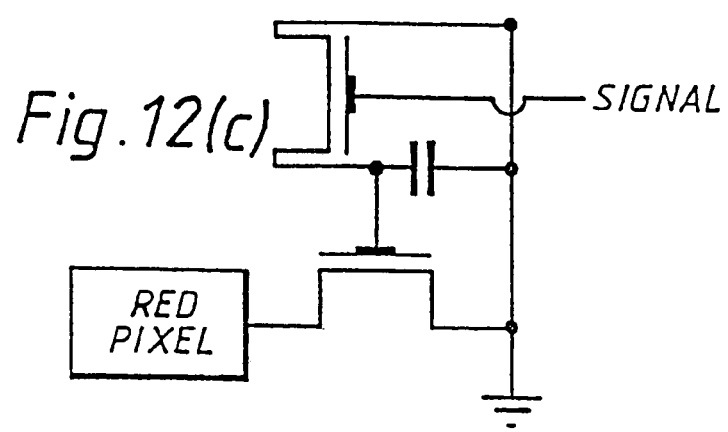
FIG. 12c shows a simple circuit for controlling a display pixel.

Suitable control circuitry for the pixel is shown in FIG. 12(c). As shown in FIG. 12(c), the circuitry drives a single, for example, red pixel. An array of suitable driving circuits and pixels can be provided for formation of an red, green and blue pixel set.

Lens

Figure 13:
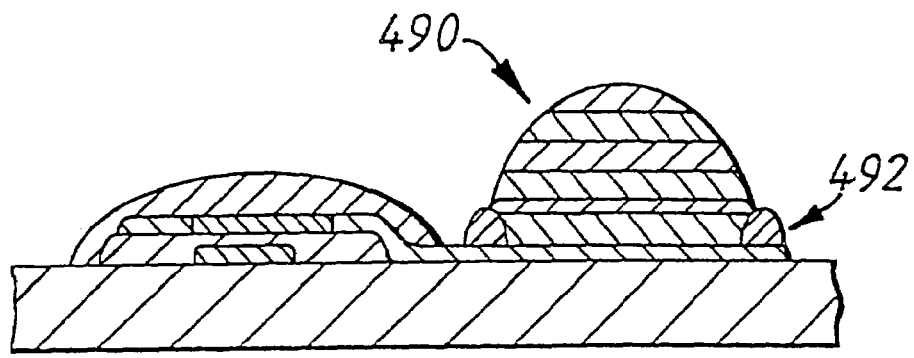
FIG. 13 shows a cross-sectional view of a lens formed on a display pixel.

FIG. 13 illustrates the formation of a lenslet 490 directly on to an electroluminescent polymeric pixel 492. The lenslet may be formed from multiple shaped layers of transparent polymeric material. The lenslet can enables displayed information to be focused on a windscreen, visor or other surface.

Battery

Figure 14:
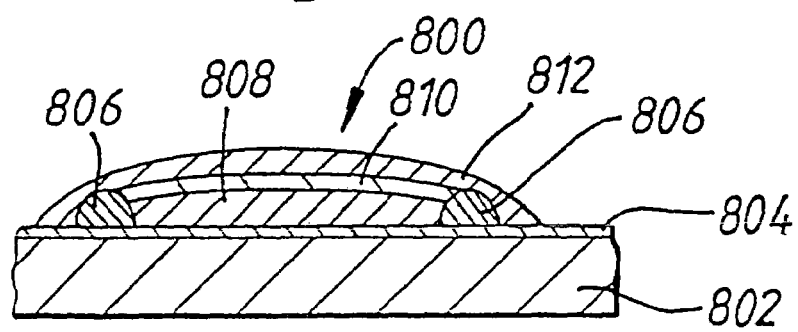
FIG. 14 shows a cross-sectional view of a polymeric battery.

FIG. 14 shows a cross-section of a rechargeable polymeric battery 800. The battery 800 comprises a flexible or rigid substrate 802 (formed from, for example, metal, plastic, polymer or glass). An organic or metallic negative electrode 804 (formed from, for example, Li—Al) is deposited on the substrate. An insulating containment well 806 (formed from for example, PMMA, polyimide, acrylate or PTFE) is deposited on the negative electrode 804. Within the well 806 are deposited, in turn, an electrolyte separator 808 (formed from, for example, $LiBF_4$) and an organic or metallic positive electrode 810 (formed from, for example, organo-metallic, colloid or polyaniline). The well 806, electrolyte separator 808 and electrode 810 are covered with a protective coating/atmospheric barrier 812 (formed from, for example, BCB, PMMA or acrylate).

Figure 15:
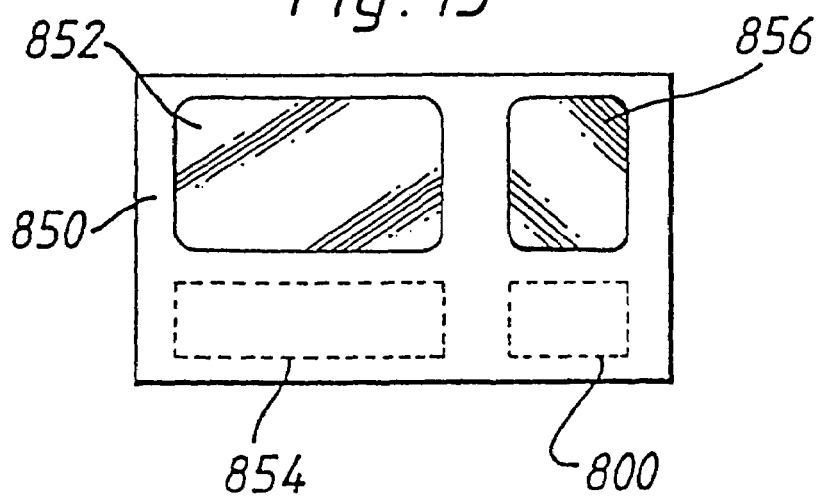
FIG. 15 shows a flexible card including a polymeric battery.
Figure 16A:
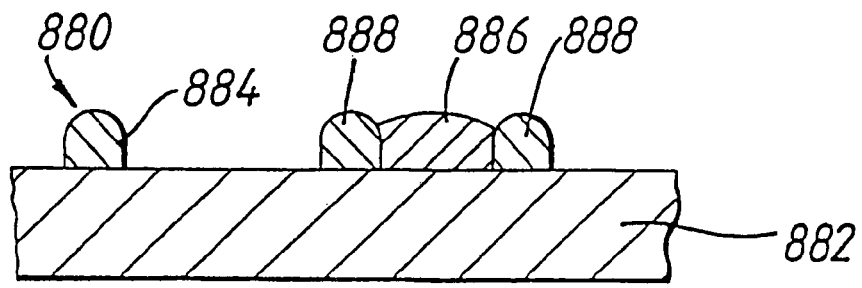
FIG. 16a shows a cross-sectional view of a plurality of quantum dots.
Figure 16B:
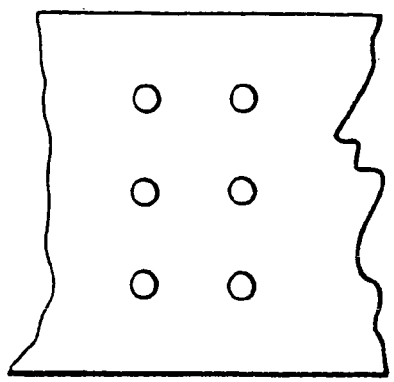
FIGS. 16b and 16c show top views of arrays of quantum dots.
Figure 16C:
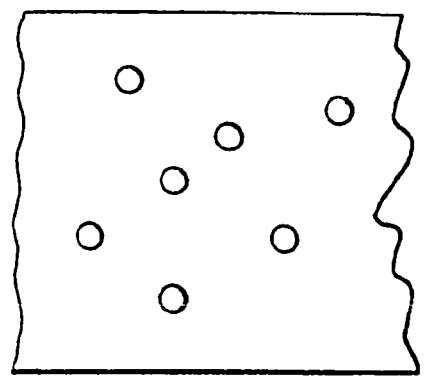
Figure 16D:
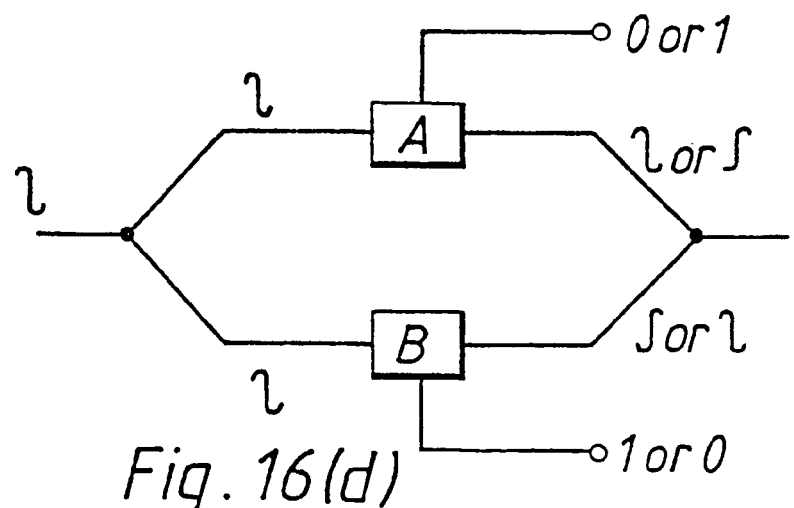
FIG. 16d shows a circuit for a quantum device interference gate.

The battery 800 typically has a battery height less than or equal to 2 mm, and a diameter less than or equal to 20 mm. This makes the battery particularly suitable for deposition on an electronically active smart card for banks, theatres, airports, train/bus stations, conventions and conferences. An example of such a card 850 is shown in FIG. 15. The card 850 includes a mini display 852 so that the card holder can access data independent of the end use interrogation equipment. Intelligent cards have on-board silicon chips to provide the necessary logic processing storage. These chips are located in the polymer electronic logic region 584. A polymeric thin film solar panel 586 may also be deposited on the card. Each integer may be connected by polymeric conductive tracks.

Quantum Dots

FIG. 16(*a*) is a cross-section showing a plurality of quantum dots 880 deposited on a substrate 882. The dots may be isolated—in FIG. 16(*a*) quantum dot 884 is isolated—or an insulator in-fill 886 may be deposited inbetween adjacent quantum dots 888. The quantum dots may have a width of 10 nm or less, the height of the dots preferably being less than or equal to the width of the dots; at such small scale, the quantum dots have a tendency to form a substantially hemispherical structure due to the dominance of surface tension effects.

The quantum dots may be formed in a regular array, as shown in FIG. 16(*b*), or in an irregular array, as shown in FIG. 16(*c*), as required.

The ability to deposit quantum dots using drop on demand printing enables quantum device interference logic gates, such as that shown in FIG. 16(*d*), to be formed in a cheap and reproducible manner.

Electrical and Optical Cables

Figure 17A:
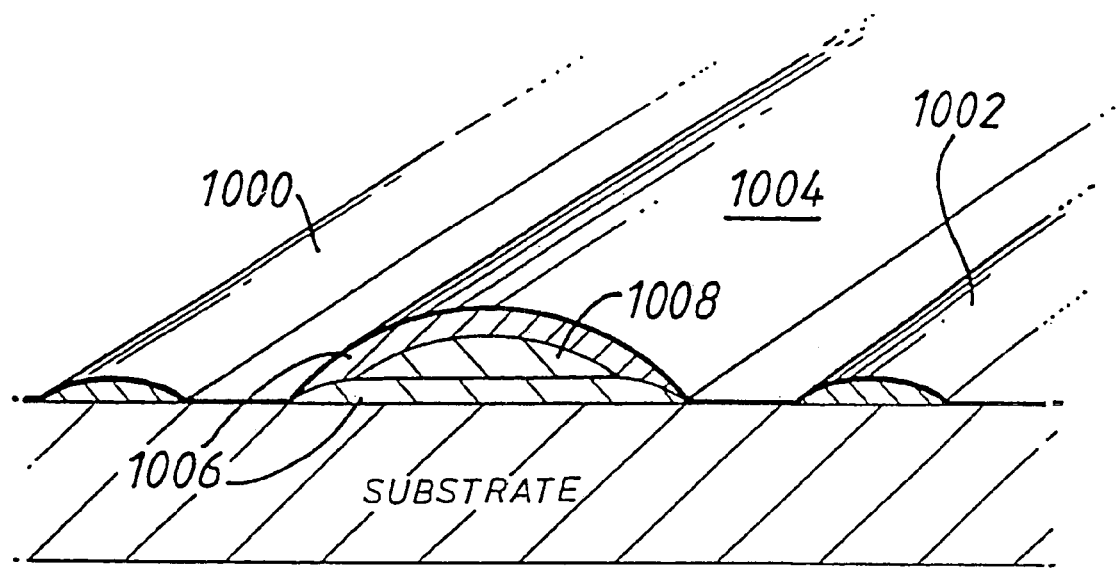
FIG. 17a shows a cross-sectional view of electrical and optical cables.
Figure 17B:
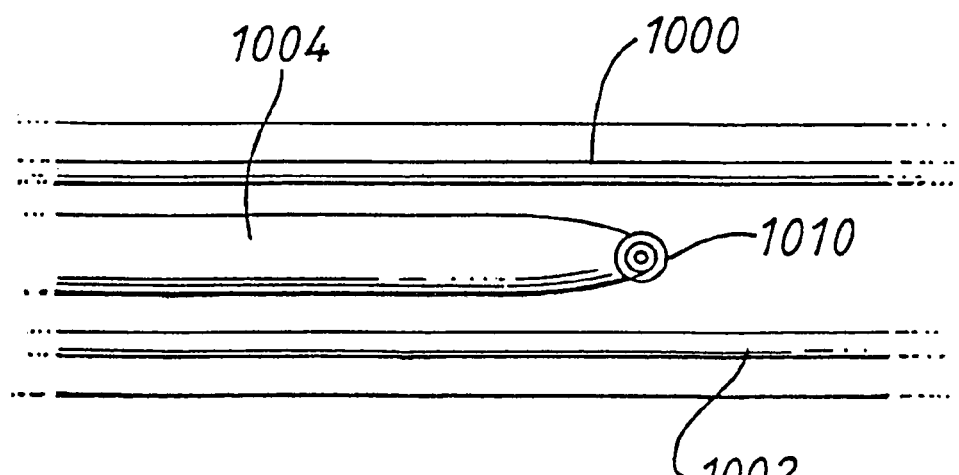
FIG. 17b shows a top view of electrical and optical cables.

FIGS. 17(*a*) and 17(*b*) are cross-sectional and top views respectively of electrical nd optical cables formed on a substrate using the technique of drop on demand printing. By way of example, electrical cable 1000 is formed from a metallic electrical conductor for carrying a power supply or electrical signals, and electrical cable 1002 is formed from a polymeric electrical conductor for carrying electrical signals. Optical cable 1004 comprises cladding layers 1006 which define an optical core 1008 for carrying optical signals. As shown in FIG. 17(*b*), lenslet entrance or exit 1010 may be provided for inputting optical signals to or outputting optical signals from the optical cable 1004.

With respect to all of the above examples, drop on demand printing may be used to deposit at least one, preferably some, and more preferably all of the various portions of the examples.

Selective Area Doping

Figure 18:
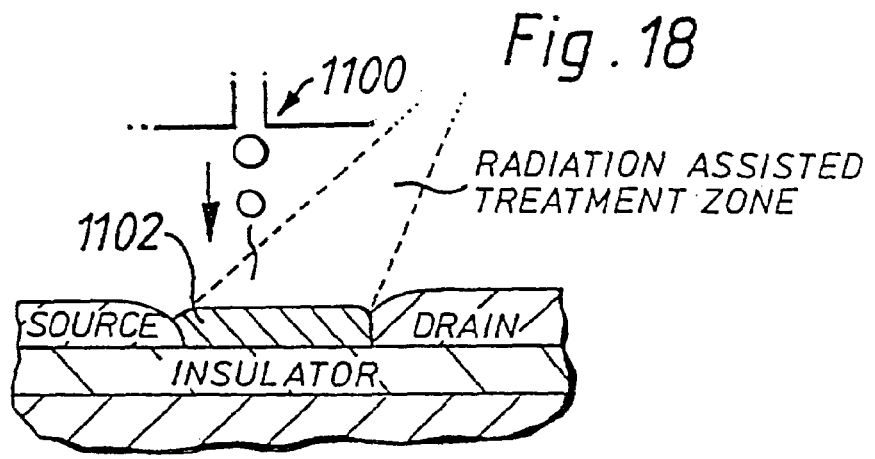
FIG. 18 illustrates selective area liquid doping.

FIG. 18 illustrates the technique of selective area doping using drop on demand printing. Drop on demand printing may be used to selectively introduce a liquid to a surface to induce electronic state changes at, or close to, the point of printing in order to create a controlled change in the electronic performance of the bulk, thick film, thin film material to be treated.

In FIG. 18, droplets are deposited from printhead 1100 onto the semiconductor region 1102 of a polymeric transistor. The droplets impinge the semiconductor region, where liquid uptaking causes localised doping. As illustrated in FIG. 14, the doping region may be illuminated by a suitable form of radiation (infrared, uv, etc.) in order to provide improved control of the doping process. Such controlled doping or loading of a surface/sub-surface region introduces mobile charges that affect the current carrying capability/mobility of the device being locally doped with a majority (or minority) carrier impurity. The doping can introduce local material property changes as a result of the mode of doping, including chemical, protonic, electrochemical, optical, and electronic. Depending on the materials used, diffusion may occur through an entire layer. This can enable, for example, the gate region of a transistor to be formed by means of selective area doping of a previously undoped area.

Printing Particulate Loaded Structures

Figure 19:
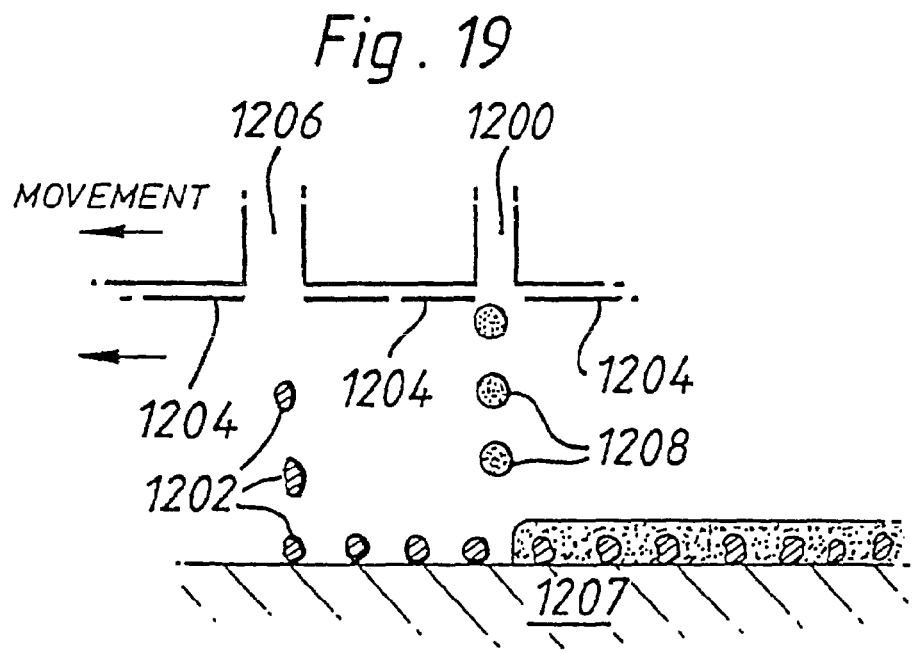
FIG. 19 illustrates the formation of particulate loaded structures.

FIG. 19 illustrates the deposition of a particulate loaded system using an integrated particulate dispensing system that is adjacent to each nozzle 1200. The particulates 1202 are dispensed using a piezoelectric transducer cavity that ensures the particulates do not stick together. Each dispenser is addressable independently and has associated with it a shutter assembly 1204 to seal the particle dispenser orifice 1206. Particulates 1202 of size less than or equal to 5 microns in diameter may be deposited on substrate 1207, although larger particles can be employed if desired. The shutter assembly 1206 may form part of a larger assembly that seals the ink jet nozzles 1200 as well, or it may be a standalone assembly. In any event the movement of the shutter assembly 1206 or assemblies will be such as to ensure particulate transfer prior to, during, or after the printing of the polymeric, organic, or inorganic binder material 1208. The shutter assembly is generally spaced from the orifice 1206, the spacing typically being set by the thickness of a low friction runner layer, for example, PTFE, provided between the nozzle and orifice assembly and the shutter assembly 1206.

Printing on to MEMS

Figure 20:
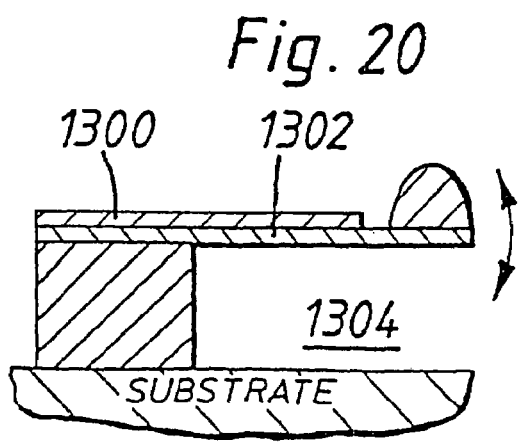
FIG. 20 shows a cross-sectional view of a piezoelectric layer deposited on an MEM.

FIG. 20 illustrates a piezoelectric thin film 1300 deposited on to a $SiO_2$ or Is cantilever 1302. The thin film 1300 is used to oscillate the cantilever 1302, which deflects into or away from a dielectric or air gap 1304. Such a structure could be used to fire liquid droplets from a nozzle, motion of the cantilever acting to force droplets from the nozzle.

Deposition Materials and Substrates

Suitable deposition materials include, but are not limited to:

Conductive Polymers polyaniline, polyacetylene, polythiophene, polypyrrole, indoles, furans, substituted phthalocyanines, stearic acid, trans-polyacetylene, PA, poly(para-phenylenevinylene), PPV, and poly(para-phenylene), PPP, etc.

Electrolytes and Electrolyte Separator $LiBF_4$, poly(2-acrylamido-2-methylpropanesulfonic acid), etc.

Fluorescent Materials
  Fluorescent dyed polyesters, fluorescent dyed polyethers, phosphors, ZnS:Ag, ZnS:Cu, Al, Y2O2S:Eu, Y2O3:Eu, ZnO:Zn, ZnGa2O4, SrGa2S4:Eu, SrGa2S4:Ce, Y3Al5O12:Tb, Y2Si5:Tb, YVO4, etc.

Insulators
  ButylCycloButadiene (BCB), PMMA, polyamide, polyimide, polysilane, spin-on-glass, methylsilsesquioxide polymer, etc.

Metallic Colloids
  Au, Pt, Ni, Cu, In, Sn, etc.

Metallic Pastes
  Ag-dag, Au-dag, C-dag, particulate or chemically doped polymeric systems, cermets (polyimide-Cu, etc.), MOCVD-based particles, milled ceramics, milled crystals, milled thin films, heterogeneous gas phase generated particles, liquid-based particles etc.

Miscellaneous
  Acid, alkali, fluorocarbon, $H_2O$, $H_2O_2$, HCl, Hydrocarbon, Iodine, Oxygen, Quinone, Solvents, stable orthorhombic phase crystal structure of the organic compound p-nitrophenyl nitronyl nitroxide (p-NPNN), Oligomers, Nitronyl nitroxides, Phenoxyl radicals, HNN (2-hydro NN), Biradical:m-BNN (m-Phenylenebis[nitronyl nitroxide]), foams, hybridised organic-inorganic system, phospholipids (including those containing a mol % of cholesterol), arachidic acid monolayer, etc.

Non-Wetting
  Perfluorocarbons, etc.

Organo-Metallics and Metallo-Organics
  Cu, Sn, In, hybridised organo-metallics and metallo-organics (Cu dispersed in an insulating matrix, etc.), tungsten oxide, nickel oxide, etc.

Organically-Modified Ceramics (Ormocers)
  including Ormosils, siloxanes, silanes (TEOS—tetraethoxysilane)

Polysilane Compounds
  including modular silylenes

Protective Coatings
  multifunctional acrylate, PMMA, Ormocers, silane compounds [TCS, BTCSE, TMCS, etc.] etc.

Semiconductors and Light Emitters
  pentacenes, polyanilines, polythiophenes, polyacetylenes [including Durham pre-cursor route], PPV derivatives, (i.e., MEH-PPV: poly[2-methoxy-5-{2'-ethyl-hexyloxy}-1,4-phenylene vinylene, [soluble in common organic solvents such as tetrahydrofuran [THF], chloroform, dichloromethane, etc.]), MEH-PPV blend, poly (arylenevinylenes), poly(3-alkylthiophenes), CN—PPV, PPV, PT, PPP, poly(phenylenes), poly(quinoxalines), poly(phenyleneacetylenes), fullerene and fulleride molecules, including but not limited to, $C_{70}$, $C_{76}$, $C_{78}$, $C_{82}$, $C_{84}$, and $C_{60}$-TDAE. (tetrakis-dimethylamino ethylene), polyfluorene crystalline polymer, etc.

Sol-Gel Compounds
  $SnO_x$, ITO, PT, PZT, PLZT, tungsten oxide, $WO_3$, $TiO_2$, ZnO, $SnO_2$, $NiO_x$, $MnO_2$, Prussian blue, etc.

Typical substrates include, but are not limited to, borosilicate glass, polyethylene, acrylate sheeting, PVC sheeting, polycarbonate sheeting, fibre-reinforced epoxy, PMMA, PCB's, silicon, GaAs, and $LiNbO_3$ crystals, thin film membrane [silicon compound, $SiO_2$, SiC, $Si_3N_4$, etc.], etc. Typical thermoplastics include nylon.

It will be understood that the present invention has been described above purely by way of example, and modifications of detail can be made within the scope of the invention.

Each feature disclosed in the description, and (where appropriate) the claims and drawings may be provided independently or in any appropriate combination.

The invention claimed is:

1. A method of forming an electrically conductive circuit element on a surface using a drop-on-demand deposition technique to deposit droplets of inorganic-based fluid, the method comprising depositing a plurality of droplets of said fluid to form the circuit element, the conductivity of the circuit element being in the range from about $1 \times 10^0$ S.cm$^{-1}$ to about $4 \times 10^5$ S.cm$^{-1}$.

2. A method according to claim 1, wherein the fluid comprises conductive particles.

3. A method according to claim 2, wherein the conductive particles have a dimension less than or equal to 1 micron.

4. A method according to claim 1, wherein the circuit element comprises a plurality of stacked electrically conductive elements connected by vias to provide electrical conduction between elements.

5. A method according to claim 4, wherein the circuit element comprises at least one isolation layer, the or each isolation layer being disposed between adjacent elements.

6. A method according to claim 1, comprising subjecting the deposition material to radiation treatment before, during or after deposition.

7. A method according to claim 1, comprising curing the deposited fluid by exposing the deposited fluid to electromagnetic radiation.

8. A method according to claim 1, wherein the circuit element comprises a diode.

9. A method according to claim 1, wherein the circuit element comprises a plurality of discrete portions.

10. A method according to claim 1, further comprising using an electrostatic spray head to deposit said deposition material.

11. An electrically conductive circuit element formed on a surface using a drop-on-demand deposition technique to deposit multiple droplets of inorganic-based fluid, the conductivity of the electrically conductive element being in the range from about $1 \times 10^0$ S.cm$^{-1}$ to $4 \times 10^5$ S.cm$^{-1}$.

12. An element according to claim 11, wherein the fluid comprises conductive particles.

13. An element according to claim 12, wherein the conductive particles have a dimension less than or equal to 1 micron.

14. An element according to claim 11, comprising a plurality of stacked electrically conductive elements connected by vias to provide electrical conduction between elements.

15. An element according to claim 14, comprising at least one isolation layer, the or each isolation layer being disposed between adjacent elements.

16. An element according to claim 11, comprising a plurality of discrete portions, each portion being formed from respective materials.

17. An element according to claim 11, the fluid droplets comprising at least one of a sol-gel, an organically-modified ormocer, and an organically-modified silicate.

* * * * *

UNITED STATES PATENT AND TRADEMARK OFFICE
CERTIFICATE OF CORRECTION

| | | |
|---|---|---|
| PATENT NO. | : 7,129,166 B2 | Page 1 of 1 |
| APPLICATION NO. | : 10/760611 | |
| DATED | : October 31, 2006 | |
| INVENTOR(S) | : Stuart Philip Speakman | |

It is certified that error appears in the above-identified patent and that said Letters Patent is hereby corrected as shown below:

\*\* In claim 11, column 46, line 46, after "$1 \times 10^°$ S.cm$^{-1}$ to", add --about--.\*

Signed and Sealed this

Sixth Day of February, 2007

JON W. DUDAS
*Director of the United States Patent and Trademark Office*